United States Patent
Romero

(10) Patent No.: US 10,837,943 B2
(45) Date of Patent: Nov. 17, 2020

(54) MAGNETIC FIELD SENSOR WITH ERROR CALCULATION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/606,325

(22) Filed: May 26, 2017

(65) Prior Publication Data
US 2018/0340911 A1 Nov. 29, 2018

(51) Int. Cl.
*G01N 27/90* (2006.01)
*G01D 5/14* (2006.01)
(Continued)

(52) U.S. Cl.
CPC ......... *G01N 27/9033* (2013.01); *G01D 3/036* (2013.01); *G01D 5/145* (2013.01);
(Continued)

(58) Field of Classification Search
CPC .... G01R 33/0023; G01R 33/07; G01R 33/09; G01R 33/093; G01R 33/10; G01R 33/06;
(Continued)

(56) References Cited

U.S. PATENT DOCUMENTS

| | | |
|---|---|---|
| 3,132,337 A | 5/1964 | Martin |
| 3,195,043 A | 7/1965 | Burig et al. |

(Continued)

FOREIGN PATENT DOCUMENTS

| | | |
|---|---|---|
| CH | 683 469 A5 | 3/1994 |
| CN | 102323554 A | 1/2012 |

(Continued)

OTHER PUBLICATIONS

Response to Korean Office Action dated May 30, 2018 for Korean Application No. 10-2016-7004178; Response (with English claims) filed Jul. 19, 2018; 41 pages.
Japanese Office Action (with English translation) dated Jun. 1, 2018 for Japanese Application No. 2016-528006; 7 pages.
Response to U.S. Non-Final Office Action dated Jan. 9, 2018 for U.S. Appl. No. 15/709,739; Response filed Jun. 25, 2018; 11 pages.
(Continued)

*Primary Examiner* — Jay Patidar
*Assistant Examiner* — Brent J Andrews
(74) *Attorney, Agent, or Firm* — Daly, Crowley, Mofford & Durkee, LLP

(57) ABSTRACT

A magnetic field sensing system may include a first magnetic field sensing element; a second magnetic field sensing element; means for generating a first magnetic field having a first non-zero frequency; means for generating a second magnetic field having a second frequency; a conductive target positioned to generate a reflected magnetic field in response to the first magnetic field; means for producing a first signal representing the first magnetic field and the reflected magnetic field during a first alternating time period; means for producing a second signal representing the second magnetic field during a second alternating time period; means for calculating an error value as a function of the first and second signals, wherein the error value is based, at least in part, on the second signal during the first time period; and means for applying the error value to the first signal during the first alternating time period.

26 Claims, 8 Drawing Sheets

(51) Int. Cl.
*G01R 33/028* (2006.01)
*G01D 3/036* (2006.01)
*G01R 33/06* (2006.01)
*G01R 33/10* (2006.01)
*G01V 3/10* (2006.01)

(52) U.S. Cl.
CPC ......... *G01R 33/0283* (2013.01); *G01R 33/06* (2013.01); *G01R 33/10* (2013.01); *G01V 3/107* (2013.01); *G01N 2223/052* (2013.01)

(58) Field of Classification Search
CPC .. G01R 33/0283; G01B 7/003; G01D 5/2013; G01D 5/145; G01D 3/036; G01N 27/9033; G01V 3/107
See application file for complete search history.

(56) References Cited

U.S. PATENT DOCUMENTS

| | | |
|---|---|---|
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |
| 4,048,670 A | 9/1977 | Eysermans |
| 4,180,753 A | 12/1979 | Cook, II |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,703,378 A | 10/1987 | Imakoshi et al. |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,954,777 A | 9/1990 | Klopfer et al. |
| 4,970,411 A | 11/1990 | Halg et al. |
| 4,983,916 A | 1/1991 | Iijima et al. |
| 4,991,447 A | 2/1991 | Yahagi et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,329,416 A | 7/1994 | Ushiyama et al. |
| 5,332,956 A | 7/1994 | Oh |
| 5,332,965 A | 7/1994 | Wolf et al. |
| 5,351,028 A | 9/1994 | Krahn |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama et al. |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,514,953 A | 5/1996 | Schultz et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet al. |
| 5,798,462 A | 8/1998 | Briefer et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,896,030 A | 4/1999 | Hasken |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,032,536 A | 3/2000 | Peeters et al. |
| 6,043,644 A | 3/2000 | de Coulon et al. |
| 6,043,646 A | 3/2000 | Jansseune |
| 6,064,198 A | 5/2000 | Wolf et al. |
| 6,136,250 A | 10/2000 | Brown |
| 6,169,396 B1 | 1/2001 | Yokotani et al. |
| 6,175,232 B1 | 1/2001 | De Coulon et al. |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |

(56) References Cited

U.S. PATENT DOCUMENTS

| | | |
|---|---|---|
| 6,297,627 B1 | 10/2001 | Towne et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,366,079 B1 | 4/2002 | Uenoyama |
| 6,392,478 B1 | 5/2002 | Mulder et al. |
| 6,429,640 B1 | 8/2002 | Daughton et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,504,363 B1 | 1/2003 | Dogaru et al. |
| 6,525,531 B2 | 2/2003 | Forrest et al. |
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,862 B1 | 5/2003 | Goto et al. |
| 6,566,872 B1 | 5/2003 | Sugitani |
| 6,640,451 B1 | 11/2003 | Vinarcik |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,707,298 B2 | 3/2004 | Suzuki et al. |
| 6,759,843 B2 | 7/2004 | Furlong |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 6,956,366 B2 | 10/2005 | Butzmann |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,132,825 B2 | 11/2006 | Martin |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,705,586 B2 | 4/2010 | Van Zon et al. |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,982,454 B2 | 7/2011 | Fernandez et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,649 B2 | 1/2012 | Kaita et al. |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,299,783 B2 | 10/2012 | Fernandez et al. |
| 8,362,579 B2 | 1/2013 | Theuss et al. |
| 8,447,556 B2 | 5/2013 | Friedrich et al. |
| 8,461,677 B2 | 6/2013 | Ararao et al. |
| 8,486,755 B2 | 7/2013 | Ararao et al. |
| 8,542,010 B2 | 9/2013 | Cesaretti et al. |
| 8,559,139 B2 | 10/2013 | Theuss |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,520 B2 | 1/2014 | Doogue et al. |
| 8,629,539 B2 | 1/2014 | Milano et al. |
| 8,680,846 B2 | 3/2014 | Cesaretti et al. |
| 8,680,848 B2 | 3/2014 | Foletto et al. |
| 8,754,640 B2 | 6/2014 | Vig et al. |
| 8,773,124 B2 | 7/2014 | Ausserlechner |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaretti et al. |
| 9,201,123 B2 | 12/2015 | Elian et al. |
| 9,228,860 B2 | 1/2016 | Sharma et al. |
| 9,411,025 B2 | 8/2016 | David et al. |
| 9,664,494 B2 | 5/2017 | Fernandez et al. |
| 2001/0002791 A1 | 6/2001 | Tsuge et al. |
| 2001/0009367 A1 | 7/2001 | Seitzer et al. |
| 2001/0026153 A1 | 10/2001 | Nakamura et al. |
| 2002/0027488 A1 | 3/2002 | Hayat-Dawoodi et al. |
| 2002/0084923 A1 | 7/2002 | Li |
| 2002/0097639 A1 | 7/2002 | Ishizaki et al. |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0189285 A1 | 9/2004 | Uenoyama |
| 2004/0196045 A1 | 10/2004 | Larsen |
| 2004/0263014 A1 | 12/2004 | Miya |

(56) References Cited

U.S. PATENT DOCUMENTS

| | | |
|---|---|---|
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0140355 A1 | 6/2005 | Yamada et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0038561 A1 | 2/2006 | Honkura et al. |
| 2006/0068237 A1 | 3/2006 | Murphy et al. |
| 2006/0097717 A1 | 5/2006 | Tokuhara et al. |
| 2006/0125473 A1 | 6/2006 | Frachon et al. |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0110199 A1 | 5/2007 | Momtaz et al. |
| 2007/0170533 A1 | 7/2007 | Doogue et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0137784 A1 | 6/2008 | Krone |
| 2008/0211492 A1 | 9/2008 | Tsukada et al. |
| 2008/0237818 A1 | 10/2008 | Engel et al. |
| 2008/0238410 A1 | 10/2008 | Charlier et al. |
| 2008/0258722 A1 | 10/2008 | Zon et al. |
| 2008/0270067 A1 | 10/2008 | Eriksen et al. |
| 2009/0001964 A1 | 1/2009 | Strzalkowski |
| 2009/0009163 A1 | 1/2009 | Yamada |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0137398 A1 | 5/2009 | Bozovic et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0167301 A1 | 7/2009 | Ausserlechner |
| 2009/0168286 A1 | 7/2009 | Berkley et al. |
| 2009/0206831 A1 | 8/2009 | Fermon et al. |
| 2009/0243601 A1 | 10/2009 | Feldtkeller |
| 2009/0251134 A1 | 10/2009 | Uenoyama |
| 2009/0256552 A1 | 10/2009 | Guo et al. |
| 2009/0315543 A1 | 12/2009 | Guo et al. |
| 2010/0033175 A1 | 2/2010 | Boeve et al. |
| 2010/0052667 A1 | 3/2010 | Kohama et al. |
| 2010/0053789 A1 | 3/2010 | Duric et al. |
| 2010/0072988 A1 | 3/2010 | Hammerschmidt et al. |
| 2010/0188078 A1 | 7/2010 | Foletto et al. |
| 2010/0201356 A1 | 8/2010 | Koller et al. |
| 2010/0207620 A1 | 8/2010 | Gies |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0004278 A1 | 1/2011 | Aghassian et al. |
| 2011/0018533 A1 | 1/2011 | Cesaretti et al. |
| 2011/0031960 A1 | 2/2011 | Hohe et al. |
| 2011/0050220 A1 | 3/2011 | Bootle et al. |
| 2011/0127998 A1 | 6/2011 | Elian et al. |
| 2011/0187354 A1 | 8/2011 | Zieren et al. |
| 2011/0224537 A1 | 9/2011 | Brunner |
| 2011/0267040 A1 | 11/2011 | Frachon |
| 2011/0285384 A1 | 11/2011 | Nomura |
| 2012/0019236 A1 | 1/2012 | Tiernan et al. |
| 2012/0019239 A1 | 1/2012 | Decitre |
| 2012/0062215 A1 | 3/2012 | Ide et al. |
| 2012/0293167 A1 | 11/2012 | Kitanaka et al. |
| 2012/0303305 A1 | 11/2012 | Bergqvist et al. |
| 2013/0113474 A1 | 5/2013 | Elian |
| 2013/0147470 A1 | 6/2013 | Mulholland et al. |
| 2013/0207648 A1 | 8/2013 | Zibold et al. |
| 2013/0214777 A1 | 8/2013 | Itoi |
| 2013/0241543 A1 | 9/2013 | Stenson et al. |
| 2013/0249029 A1 | 9/2013 | Vig et al. |
| 2013/0249544 A1 | 9/2013 | Vig et al. |
| 2013/0278246 A1 | 10/2013 | Stegerer et al. |
| 2013/0300401 A1 | 11/2013 | Krapf et al. |
| 2013/0300402 A1 | 11/2013 | Liu et al. |
| 2013/0300406 A1 | 11/2013 | Pepka et al. |
| 2014/0184214 A1 | 7/2014 | Schäffer et al. |
| 2014/0327435 A1 | 11/2014 | Rohrer |
| 2014/0333295 A1* | 11/2014 | Fernandez ......... G01R 33/0023 324/207.12 |
| 2015/0022187 A1 | 1/2015 | Taylor et al. |
| 2015/0022193 A1 | 1/2015 | Burdette et al. |
| 2015/0022197 A1 | 1/2015 | David et al. |
| 2015/0022198 A1* | 1/2015 | David ............... G01D 5/2013 324/251 |
| 2015/0211895 A1 | 7/2015 | Reitsma et al. |
| 2015/0236869 A1 | 8/2015 | Vreeland et al. |
| 2015/0323612 A1 | 11/2015 | Latham |
| 2016/0069662 A1 | 3/2016 | Mullenix et al. |
| 2016/0123771 A1 | 5/2016 | David et al. |
| 2016/0123774 A1 | 5/2016 | Foletto et al. |
| 2016/0139230 A1 | 5/2016 | Petrie et al. |

FOREIGN PATENT DOCUMENTS

| | | |
|---|---|---|
| CN | 102483443 A | 5/2012 |
| CN | 102713654 A | 10/2012 |
| CN | 10 2011 102483 | 11/2012 |
| CN | 102954808 A | 3/2013 |
| DE | 25 18 054 | 11/1976 |
| DE | 40 31 560 A | 4/1992 |
| DE | 195 39 458 A1 | 4/1997 |
| DE | 196 34 715 A1 | 3/1998 |
| DE | 196 50 935 A1 | 6/1998 |
| DE | 198 38 433 | 3/1999 |
| DE | 198 51 839 A1 | 11/1999 |
| DE | 199 61 504 A1 | 6/2001 |
| DE | 102 10 184 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 | 11/2010 |
| DE | 10 2011 102483 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0629834 A1 | 12/1994 |
| EP | 0 680 103 A1 | 11/1995 |
| EP | 0 898 180 A2 | 2/1999 |
| EP | 0 944 888 B1 | 10/2001 |
| EP | 1306687 A2 | 5/2003 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 850 143 A1 | 10/2007 |
| EP | 2 063 229 | 5/2009 |
| EP | 1797496 16 | 7/2009 |
| EP | 2402719 | 1/2012 |
| EP | 2 685 273 A1 | 1/2014 |
| EP | 3 139 190 A1 | 8/2017 |
| FR | 2 748 105 A1 | 10/1997 |
| FR | 2 909 756 | 6/2008 |
| GB | 2135060 A | 8/1984 |
| GB | 2276727 A | 10/1994 |
| GB | 2 481 482 | 12/2011 |
| JP | S5771504 A | 5/1982 |
| JP | 60-152950 | 8/1985 |
| JP | S60182503 A | 9/1985 |
| JP | 61-48777 | 3/1986 |
| JP | 2009-250725 A | 3/1988 |
| JP | S6367583 A | 3/1988 |
| JP | 363 084176 A | 4/1988 |
| JP | 63-263782 | 10/1988 |

(56) References Cited

FOREIGN PATENT DOCUMENTS

| | | |
|---|---|---|
| JP | 63-300911 | 12/1988 |
| JP | H02-116753 | 5/1990 |
| JP | H03-29817 | 2/1991 |
| JP | H0335182 A | 2/1991 |
| JP | H04-095817 | 3/1992 |
| JP | H06-273437 | 9/1994 |
| JP | 08-097486 | 4/1996 |
| JP | H08-511348 A | 11/1996 |
| JP | 09-166612 | 6/1997 |
| JP | 10-332725 | 12/1998 |
| JP | H10-318784 A | 12/1998 |
| JP | 11-064363 | 3/1999 |
| JP | 11-074142 | 3/1999 |
| JP | 2000-183241 | 6/2000 |
| JP | 2001-043475 A | 2/2001 |
| JP | 2001-141738 | 5/2001 |
| JP | 2001-165702 A | 6/2001 |
| JP | 2001-1659951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2003-202365 A | 7/2003 |
| JP | 2003-287439 A | 10/2003 |
| JP | 2004-055932 | 2/2004 |
| JP | 2004-093381 | 3/2004 |
| JP | 2004-152688 | 5/2004 |
| JP | 2004-356338 A | 12/2004 |
| JP | 2004-357858 A | 12/2004 |
| JP | 2005-517928 | 6/2005 |
| JP | 2005-337866 | 12/2005 |
| JP | 2005-345302 | 12/2005 |
| JP | 2006-003096 A | 1/2006 |
| JP | 2006-3116 A | 1/2006 |
| JP | 2006-003116 A | 1/2006 |
| JP | 2006-275764 | 10/2006 |
| JP | 2006-284466 A | 10/2006 |
| JP | 2007-012582 A | 1/2007 |
| JP | 2007-218799 | 8/2007 |
| JP | 2007-240202 | 9/2007 |
| JP | 2008-180550 | 8/2008 |
| JP | 2008-264569 | 11/2008 |
| JP | 2008-286667 A | 11/2008 |
| JP | 2009-002911 A | 1/2009 |
| JP | 2009-222524 | 10/2009 |
| JP | 2009-250931 A | 10/2009 |
| JP | 2010-537207 A | 12/2010 |
| JP | 2011/086479 | 4/2011 |
| JP | 2012-501446 A | 1/2012 |
| KR | 2012-0040247 A | 4/2012 |
| KR | 2013 0019872 A | 2/2013 |
| WO | WO 88/09026 | 11/1988 |
| WO | WO 1993/12403 | 6/1993 |
| WO | WO 1994/08203 | 4/1994 |
| WO | WO 94/29672 A1 | 12/1994 |
| WO | WO 1995/18982 | 7/1995 |
| WO | WO 96/02849 A1 | 2/1996 |
| WO | WO 1999/49322 | 9/1999 |
| WO | WO 2001/40790 A1 | 6/2001 |
| WO | WO 2001/74139 A2 | 10/2001 |
| WO | WO 2001/74139 A3 | 10/2001 |
| WO | WO 2003/069358 A2 | 8/2003 |
| WO | WO 2003/069358 A3 | 8/2003 |
| WO | WO 2003/107018 A1 | 12/2003 |
| WO | WO 2004/027436 | 4/2004 |
| WO | WO 2004/072672 A1 | 8/2004 |
| WO | WO 2005/013363 A2 | 2/2005 |
| WO | WO 2005/013363 A3 | 2/2005 |
| WO | WO 2006/035342 | 4/2006 |
| WO | WO 2006/056829 | 6/2006 |
| WO | WO 2006/083479 | 8/2006 |
| WO | WO 2007/095971 A1 | 8/2007 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2008/145662 A1 | 12/2008 |
| WO | WO 2009/108422 A2 | 9/2009 |
| WO | WO 2009/108422 A3 | 9/2009 |
| WO | WO 2010/014309 A1 | 2/2010 |
| WO | WO 2010/027658 A2 | 3/2010 |
| WO | WO 2010/065315 A1 | 6/2010 |
| WO | WO 2010/096367 A1 | 8/2010 |
| WO | WO 2011/011479 A1 | 1/2011 |
| WO | WO 2012/148646 A1 | 11/2012 |
| WO | WO 2013/169455 | 11/2013 |
| WO | WO 2014/105302 A1 | 7/2014 |
| WO | WO2015/058733 A1 | 4/2015 |

OTHER PUBLICATIONS

Korean Notice of Allowance (with English translation and allowed claims) dated Jun. 29, 2018 for Korean Application No. 10-2014-7032857; 8 pages.

PCT International Search Report and Written Opinion of the ISA dated Aug. 10, 2018 for PCT/US2018/028816; 23 Pages.

Response to Chinese Office Action dated Feb. 1, 2018 for Chinese Application No. 201480040243.6; Response filed Jun. 14, 2018; 11 pages.

Japanese Office Action (with English Translation) dated May 16, 2018 for Japanese Application No. 2015-511491; 9 pages.

Korean Office Action (with English Translation) dated May 30, 2018 for Korean Application No. 10-2016-7004178; 11 Pages.

U.S. Appl. No. 15/709,739, filed Sep. 20, 2017, Pepka et al.

Response to Official Communication dated Mar. 13, 2017 for European Application No. 16193227.2; 7 pages.

U.S. Final Office Action dated Oct. 5, 2017 for U.S. Appl. No. 13/946,400; 39 pages.

U.S. Appl. No. 15/606,332, filed May 26, 2017, Latham et al.

U.S. Appl. No. 15/606,325, filed May 26, 2017, Romero.

Japanese Office Action (with English Translation) dated Jan. 13, 2017 for Japanese Application No. 2015-511491; 14 Pages.

Ahn et al.; "A New Toroidal-Meander Type Integrated Inductor with a Multilevel Meander Magnetic Core;" IEEE Transaction on Magnetics; vol. 30; No. 1; Jan. 1, 1994; 7 pages.

Allegro "Two-Wire True Zero Speed Miniature Differential Peak-Detecting Gear Tooth Sensor;" ATS645LSH; 2004; Allegro MicroSystems, Inc., Worcester, MA 01615; 14 pages.

Allegro Microsystems, Inc., "Gear-Tooth Sensor for Automotive Applications," Aug. 3, 2001; 2 pages.

Allegro MicroSystems, Inc., Hall-Effect IC Applications Guide, http://www.allegromicro.com/en/Products/Design/an/an27701.pdf, Copyright 1987, 1997; 36 pages.

Alllegro "True Zero-Speed Low-Jitter High Accuracy Gear Tooth Sensor;" ATS625LSG; 2005; Allegro MicroSystems, Inc. Worcester, MA 01615; 21 pages.

Amendment and RCE dated Jun. 9, 2015; for U.S. Appl. No. 13/946,400; 12 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.

Ausserlechner; "Limits of Offset Cancellation by the Principle of Spinning Current Hall Probe;" Proceedings of IEEE Sensors; Oct. 2004; 4 pages.

Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.

Bahreyni, et al.; "A Resonant Micromachined Magnetic Field Sensor;" IEEE Sensors Journal; vol. 7, No. 9, Sep. 2007; 9 pages.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.

(56) References Cited

OTHER PUBLICATIONS

Baschirotto et al.; "Development and Analysis of PCB Vector 2-D Magnetic Field Sensor System for Electronic Compass;" IEEE Sensors Journal vol. 6, No. 2; Apr. 2006; 7 pages.

Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.

Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10; 4 pages.

Communication Pursuant to Rule 161(1) and 162 EPC dated Feb. 23, 2016; for European Pat. App. No. 14742423.8; 2 pages.

Communication Pursuant to Rules 161(1) and 162 dated Nov. 12, 2015 for European Application No. 14726492.3-1560; 2 pages.

Daughton J: "Spin-dependent sensors", Proceedings of the IEEE New York, US, vol. 91. No. 5 May 1, 2003; 6 pages.

Decision to Grant dated Oct. 27, 2016; for European Pat. App. No. 13722619.7; 2 pages.

Demierre, et al.; "Reference Magnetic Actuator for Self-Calibration of a Very Small Hall Sensor Array;" Sensors and Actuators A97-98; Apr. 2002; 8 pages.

Dwyer, "Back-Biased Packaging Advances (SE, SG & SH versus SA & SB)," http://www.allegromicio.com/en/Products/Design/packaging_advances/index.asp, Copyright 2008; 5 pages.

European Communication under Rule 71(3) EPC, Intention to Grant dated Jun. 2, 2016 corresponding to European Application No. 13722619.7; 26 Pages.

European Extended Search Report dated Dec. 22, 2016; for European Pat. App. No. 16193227.2; 11 pages.

European Response filed on Aug. 24, 2016 to the official communication dated Feb. 23, 2016; for European Pat. App. No. 14742423.8; 13 pages.

European Response to Written Opinion filed on May 21, 2015; for European Pat. App. No. 13722619.7, 9 pages.

Final Office Action dated Aug. 28, 2015; for U.S. Appl. No. 13,946,417; 30 pages.

Final Office Action dated Jun. 9, 2015; for U.S. Appl. No. 13/946,400; 17 pages.

Final Office Action dated Oct. 20, 2016 for U.S. Appl. No. 13/946,400; 34 pages.

Final Office Action dated Oct. 6, 2016; for U.S. Appl. No. 13/946,417; 29 pages.

Frick, et al.; "CMOS Microsystem for AC Current Measurement with Galvanic Isolation;" IEEE Sensors Journal; vol. 3, No. 6; Dec. 2003; 9 pages.

Halg; "Piezo-Hall Coefficients of n-Type Silicon;" Journal of Applied Physics; vol. 64, No. 1; Jul. 1, 1988; 7 pages.

Honeywell International, Inc., "Hall Effect Sensing and Application," Micro Switch Sensing and Control, Chapter 3, http://content honeywell.com/sensing/prodinfo/solidstate/technical/hallbook.pdf, date unavailable but believed to be before Jan. 2008; 11 pages.

Hosticka; "CMOS Sensor Systems;" Sensors and Actuators A66; Apr. 1998; 7 pages.

Infineon Product Brief, TLE 4941plusC, Differential Hall IC for Wheel Speed Sensing, Oct. 2010, www.infineon.com/sensors, 2 pages.

International Preliminary Report on Patentability dated Jan. 19, 2016 for Int'l PCT Application PCT/US2014/044993; 8 pages.

International Search Report and Written Opinion dated Nov. 3, 2014 for Int'l PCT Application PCT/US2014/044993; 13 pages.

International Search Report and Written Opinion dated Oct. 28, 2014 for Int'l PCT Application PCT/US2014/044991; 13 pages.

Japanese Office Action (with English Translation) dated May 18, 2017 for Japanese Application No. 2015-511491; 8 Pages.

Japanese Office Action dated Jan. 18, 2017 for Japanese Application No. 2016-512930; 7 pages.

Japanese Voluntary Amendment with English Claims dated Dec. 28, 2016; for Japanese Pat. App. No. 2016-528006; 8 pages.

Johnson et al., "Hybrid Hall Effect Device," Appl. Phys. Lett., vol. 71, No. 7, Aug. 1997; 3 pages.

Kanda et al.; "The Piezo-Hall Effect in n-Silicon;" $22^{nd}$ International Conference on the Physics of Semiconductors; vol. 1, Jan. 1995; 4 pages.

Kapser et al.; "Integrated GMR Based Wheel Speed Sensor for Automotive Applications;" IEEE 2007 Conference on Sensors; Oct. 2007; 4 pages.

Kammerer et al.: "A Hall effect sensors network insensitive to mechanical stress;" Proceedings of IEEE Sensors; vol. 3, Oct. 2004; 4 pages.

Lagorce et al.; "Magnetic and Mechanical Properties of Micromachined Strontium Ferrite/Polyimide Composites;" Journal of Microelectromechanical Systems; vol. 6, No. 4; Dec. 1997; 6 pages.

Lequesne et al.; "High-Accuracy Magnetic Position Encoder Concept;" IEEE Transactions on Industry Applications; vol. 35, No. 3; May/Jun. 1999; 9 pages.

Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 pages.

Manic et al.; "Short and Long-Term Stability Problems of Hall Plates in Plastic Packages;" IEEE $38^{th}$ Annual International Reliability Physics Symposium; Apr. 2000; 6 pages.

Manic; "Drift in Silicon Integrated Sensors and Circuits Due to the Thermo-Mechanical Stresses;" Lausanne, École Polytechnique Fédérale De Lausanne 2000; 176 pages.

Melexis Microelectronic Systems, Hall Applications Guide, Section 3—Applications,1997; 48 pages.

Motz et al.; "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; ISBN: 1-4244-0079-1; 7 pages.

Motz, et al.; "A Chopped Hall Sensor with Small Jitter and Programmable "True Power-On" Function;" IEEE Journal of Solid-State Circuits; vol. 40, No. 7; Jul. 2005; 8 pages.

Motz, et al.; "An Integrated Hall Sensor Platform Design for Position, Angle and Current Sensing;" IEEE Sensors 2006; Exco, Daegu, Korea / Oct. 22-25, 2006; 4 pages.

Munter; "A Low-offset Spinning-current Hall Plate;" Sensors and Actuators A21-A23; 1990; 4 pages.

Munter; "Electronic Circuitry for a Smart Spinning-current Hall Plate with Low Offset;" Sensors and Actuators A; Jun. 1991; 5 pages.

Non-Final Office Action dated Dec. 3, 2015; for U.S. Appl. No. 13/946,417; 26 pages.

Non-Final Office Action dated Nov. 19, 2015; for U.S. Appl. No. 13/946,400; 24 pages.

Notice of Allowance dated Apr. 19, 2017 for U.S. Appl. No. 13/891,519; 11 pages.

Notice of Allowance dated Jul. 25, 2017 for U.S. Appl. No. 13/468,478; 10 Pages.

Notice of Allowance dated Mar. 1, 2017 for U.S. Appl. No. 13/891,519; 7 pages.

Notice of Allowance dated May 15, 2017 for U.S. Appl. No. 13/468,478; 15 Pages.

Office Action dated Mar. 20, 2015; for U.S. Appl. No. 13/946,417; 20 pages.

Office Action dated Oct. 20, 2016; for U.S. Appl. No. 13/946,400; 34 pages.

Office Action in U.S. Appl. No. 13/468,478 dated Jan. 15, 2014, 36 pages.

Oniku et al.; "High-Energy-Density Permanent Micromagnets Formed from Heterogeneous Magnetic Powder Mixtures;" IEEE $25^{th}$ International Conference on Micro Electro Mechanical Systems, Jan. 2012; 4 pages.

Park et al.; "Ferrite-Based Integrated Planar Inductors and Transformers Fabricated at Low Temperature;" IEEE Transactions on Magnetics; vol. 33; No. 5; Sep. 1997; 3 pages.

Park et al.;"Batch-Fabricated Microinductors with Electroplated Magnetically Anisotropic and Laminated Alloy Cores", IEEE Transactions on Magnetics, vol. 35, No. 5, Sep. 1999, 10 pages.

(56) References Cited

OTHER PUBLICATIONS

Partin et al.; "Temperature Stable Hall Effect Sensors;" IEEE Sensors Journal, vol. 6, No. 1; Feb. 2006; 5 pages.
Pastre, et al.; "A Hall Sensor Analog Front End for Current Measurement with Continuous Gain Calibration;" IEEE Sensors Journal; vol. 7, No. 5; May 2007; 8 pages.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 pages.
PCT International Preliminary Report and Written Opinion dated Jan. 28, 2016 for International Application No. PCT/US2014/044991; 9 pages.
PCT International Preliminary Report dated Nov. 19, 2015 for International Application No. PCT/US2014/035594; 13 pages.
PCT International Preliminary Report on Patentability and Written Opinion of the ISA dated Nov. 20, 2014; for PCT Pat. App. No. PCT/US2013/037065; 10 pages.
PCT International Search Report and Written Opinion dated Jul. 13, 2013 for International Application No. PCT/US2013/037065; 13 pages.
PCT International Search Report and Written Opinion dated Sep. 12, 2014 for International Application No. PCT/US2014/035594; 16 pages.
Popovic; "Sensor Microsystems;" Proc. $20^{th}$ International Conference on Microelectronics (MWIL 95); vol. 2, NIS, Serbia, 12-14; Sep. 1995; 7 pages.
Randhawa; "Monolithic Integrated Hall Devices in Silicon Circuits;" Microelectronics Journal; vol. 12, No. 6; Sep. 14-17, 1981; 6 pages.
Response (with Amended Claims in English) to Japanese Office Action dated Feb. 13, 2017 for Japanese Application No. 2015-511491; Response filed on Apr. 11, 2017; 10 Pages.
Response (with RCE) to U.S. Final Office Action dated Sep. 16, 2015 for U.S. Appl. No. 13/468,478; Response filed Jan. 14, 2016; 18 Pages.
Response and RCE to U.S. Final Office Action dated Feb. 16, 2016 for U.S. Appl. No.13/891,519; Response filed on May 12, 2016; 13 pages.
Response and RCE to U.S. Final Office Action dated Nov. 25, 2016 for U.S. Appl. No. 13/891,519; Response filed on Feb. 6, 2017; 18 pages.
Response filed Mar. 3, 2016 to Office Action dated Dec. 3, 2015; for U.S. Appl. No. 13/946,417; 17 pages.
Response filed Nov. 9, 2015 to Final Office Action dated Aug. 28, 2015; for U.S. Appl. No. 13/946,417; 14 pages.
Response filed Apr. 3, 2015; to Office Action dated Jan. 5, 2015; for U.S. Appl. No. 13/946,400; 13 pages.
Response filed on Jan. 19, 2017 to Final Office Action dated Oct. 20, 2016; for U.S. Appl. No. 13/946,400; 12 Pages.
Response filed on Jun. 19, 2015 to Office Action dated Mar. 20, 2015; for U.S. Appl. No. 13/946,417; 15 pages.
Response filed on Oct. 3, 2016 to the Office Action dated May 10, 2016; for U.S. Appl. No. 13/468,478; 17 pages.
Response to Communication dated Dec. 11, 2015 for European Application No. 14726492.3-1560; 17 pages.
Response to Japanese Office Action dated Jan. 18, 2017 for Japanese Application No. 2016-512930; Response Filed Apr. 18, 2017; 13 pages.
Response and RCE to Oct. 6, 2016 Final Office Action from U.S. Appl. No. 13/946,417, filed Jan. 24, 2017; 14 Pages.
Response to Office Action filed on Jun. 30, 2017 for U.S. Appl. No. 13/946,400; 12 pages.
Response to U.S. Final Office Action dated Feb. 10, 2017 for U.S. Appl. No. 13/468,478; Response filed on May 3, 2017; 9 Pages.
Response and RCE to U.S. Final Office Action dated Jul. 17, 2014 for U.S. Appl. No. 13/468,478; Response Filed Jan. 19, 2015; 12 Pages.
Response to U.S. Final Office Action dated Oct. 20, 2016 (w/RCE) for U.S. Appl. No. 13/946,400; Response filed on Feb. 23, 2017; 17 Pages.
Response to U.S. Non-Final Office Action dated Apr. 24, 2015 for U.S. Appl. No. 13/891,519; Response filed on Nov. 20, 2015; 11 pages.
Response to U.S. Non-Final Office Action dated Feb. 12, 2015 for U.S. Appl. No. 13/468,478; Response filed Jun. 18, 2015; 11 Pages.
Response to U.S. Non-Final Office Action dated Jan. 15, 2014 for U.S. Appl. No. 13/468,478; Response filed on Jun. 12, 2014; 11 Pages.
Response to U.S. Non-Final Office Action dated Jun. 3, 2016 for U.S. Appl. No. 13/891,519; Response filed on Sep. 1, 2016; 14 pages.
Response to U.S. Non-Final Office Action dated Mar. 15, 2017 for U.S. Appl. No. 13/946,417; Response filed on Jun. 14, 2017; 10 pages.
Response to U.S. Non-Final Office Action dated Nov. 19, 2015 for U.S. Appl. No. 13/946,400; Response filed Feb. 17, 2016; 11 Pages.
Ruther et al.; "Integrated CMOS-Based Sensor Array for Mechanical Stress Mapping;" $5^{th}$ IEEE Conference on Sensors, Oct. 2007; 4 pages.
Ruther et al.; "Thermomagnetic Residual Offset in Integrated Hall Plates;" IEEE Sensors Journal; vol. 3, No. 6; Dec. 2003; 7 pages.
Sargent; "Switched-capacitor IC controls feedback loop;" EDN; Design Ideas; Feb. 17, 2000; 2 pages.
Schneider; "Temperature Calibration of CMOS Magnetic Vector Probe for Contactless Angle Measurement System," IEDM 1996 4 Pages.
Schott et al.; "Linearizing Integrated Hall Devices;" 1997 International Conference on Solid-State Sensors and Actuators, Jun. 16-19, 1997; 4 Pages.
Schott, et al.; "CMOS Single-Chip Electronic Compass with Microcontroller;" IEEE Journal of Solid-State Circuits; vol. 42, No. 12; Dec. 2007; 11 pages.
Simon et al.; "Autocalibration of Silicon Hall Devices;" $8^{th}$ International Conference on Solid-State Sensors and Actuators; vol. 2; Jun. 25, 1995; 4 pages.
Smith et al.; "Low Magnetic Field Sensing with GMR Sensors;" Sensor Magazine; Part 1; Sep. 1999; http://archives.sensorsmag.com/articles/0999/76mail.shtml; pp. 1-8.
Smith et al.; "Low Magnetic Field Sensing with GMR Sensors;" Sensor Magazine; Part 2; Oct. 1999; http://archives.sensorsmag.com/articles/1099/84/mail.shtml; pp. 1-11.
Steiner et al.; "Double-Hall Sensor with Self-Compensated Offset;" International Electron Devices Meeting; Dec. 7, 1997; ISBN: 0-7803-4100-7; 4 pages.
Steiner et al; Offset Reduction in Hall Devices by Continuous Spinning Current Method; Sensors and Actuators A66; 1998; 6 pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.
Tian et al.; "Multiple Sensors on Pulsed Eddy-Current Detection for 3-D Subsurface Crack Assessment;" IEEE Sensors Journal, vol. 5, No. 1; Feb. 2005; 7 pages.
Trontelj et al; "CMOS Integrated Magnetic Field Source Used as a Reference in Magnetic Field Sensors on Common Substrate;" WEP 1-6; IMTC; May 1994; 3 pages.
U.S. Advisory Action dated Feb. 16, 2017 for U.S. Appl. No. 13/946,400; 4 Pages.
U.S. Final Office Action dated Feb. 10, 2017 for U.S. Appl. No. 13/468,478; 27 Pages.
U.S. Final Office Action dated Feb. 16, 2016 for U.S. Appl. No. 13/891,519; 14 pages.
U.S. Final Office Action dated Jul. 17, 2014 for U.S. Appl. No. 13/468,478; 13 Pages.
U.S. Final Office Action dated Nov. 25, 2016 for U.S. Appl. No. 13/891,519; 13 pages.
U.S. Final Office Action dated Sep. 16, 2015 for U.S. Appl. No. 13/468,478; 19 Pages.

(56) References Cited

OTHER PUBLICATIONS

U.S. Final Office Action dated Sep. 8, 2017 for U.S. Appl. No. 13/946,417; 56 pages.
U.S. Non-Final Office Action dated Apr. 6, 2017 for U.S. Appl. No. 13/946,400; 36 Pages.
U.S. Non-Final Office Action dated Aug. 24, 2015 for U.S. Appl. No. 13/891,519; 14 pages.
U.S. Non-Final Office Action dated Feb. 12, 2015 for U.S. Application No. 13/468,478; 14 Pages.
U.S. Non-Final Office Action dated Jan. 5, 2015 for U.S. Appl. No. 13/946,400; 56 Pages.
U.S. Non-Final Office Action dated Jun. 3, 2016 for U.S. Appl. No. 13/891,519; 19 pages.
U.S. Non-Final Office Action dated Mar. 15, 2017 from U.S. Appl. No. 13/946,417; 25 Pages.
U.S. Non-Final Office Action dated May 10, 2016 corresponding to U.S. Appl. No. 13/468,478; 20 Pages.
Udo; "Limits of Offset Cancellation by the Principle of Spinning Current Hall Probe;" Proceedings of IEEE Sensors; Oct. 2004; 4 pages.
Voluntary Amendment dated Nov. 2, 2016 with English claims for Chinese Application No. 201480040243.6; 13 pages.
Voluntary Amendment with English Claims dated Nov. 7, 2016 for Korean App. No. 10-2016-7004178; 11 Pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.
Japanese Office Action with English Translations for Japanese Application No. 2017-178549 dated Jul. 30, 2018; 4 Pages.
Response to Japanese Office Action with English translations of Amended Claims for Japanese Application No. 2016-528006 as filed on Aug. 3, 2018; 7 Pages.
Japanese Notice of Allowance (with English Translation) dated Sep. 28, 2018, for Japanese Application No. 2016-528006; 6 Pages.
Korean Notice of Allowance (with English Translation) dated Oct. 2, 2018, for Korean Application No. 10-2016-7004178; 5 Pages.
U.S. Non-Final Office Action dated Oct. 5, 2018, for U.S. Appl. No. 16/029,826; 61 Pages.
Appeal Brief dated Sep. 19, 2017 from Japanese Application No. 2015-511491 with English translations; 14 Pages.
Pre-Trial Report dated Nov. 2, 2017 from Japanese Application No. 2015-511491 with English translations and Claims on File; 7 Pages.
Response to Japanese Office Action (with English claims) dated Oct. 3, 2017 for Japanese Application No. 2016-528006; Response filed Dec. 26, 2017; 8 Pages.
Response to U.S. Final Office Action dated Oct. 5, 2017 for U.S. Appl. No. 13/946,400; Response filed Jan. 5, 2018; 11 Pages.
Korean Office Action (with English Translation) dated Dec. 20, 2017 corresponding to Korean Appl. No. 10-2014-7032857; 14 Pages.
U.S. Non-Final Office Action dated Jan. 9, 2018 corresponding to U.S. Appl. No. 15/709,739; 12 Pages.
Response to U.S. Final Office Action dated Oct. 5, 2017 for U.S. Appl. No. 13/946,400; Response filed on Feb. 27, 2018; 14 Pages.
Chinese Office Action (w/English Translation) dated Feb. 1, 2018 for Chinese Application No. 201480040243.6; 26 Pages.
Response to Final Office Action dated Jun. 15, 2018 for U.S. Appl. No. 13/946,417, filed Sep. 14, 2018; 15 Pages.
Korean Office Action with English Translation dated Nov. 22, 2017 for Korean Application No. 10-2016-7004178; 17 Pages.
U.S. Final Office Action dated Jun. 15, 2018 for U.S. Appl. No. 13/946,417; 33 Pages.
U.S. Non-Final Office Action dated Feb. 8, 2018 for U.S. Appl. No. 13/946,417; 27 Pages.
Response to U.S. Non-Final Office Action dated Feb. 8, 2018 for U.S. Appl. No. 13/946,417; Response filed Apr. 19, 2018; 14 Pages.
Response to Final Office Action dated Sep. 8, 2017 for U.S. Appl. No. 13/946,417; Response filed Nov. 29, 2017; 13 Pages.
Japanese Petition (with Machine English Translation) filed Jan. 24, 2018 for Japanese Application No. 2015-511491; 10 Pages.
Response (with English Translation) to Korean Notice of Reasons for Refusal dated Dec. 20, 2017 for Korean Application No. 10-2014-7032857; Response filed Feb. 14, 2018; 47 Pages.
Korean Response (with English Language Summary) dated Jan. 19, 2018 for Korean Application No. 10-2016-7004178; 25 Pages.
PCT International Search Report and Written Opinion dated Nov. 23, 2018 for International Application No. PCT/US2018/028475; 17 pages.
PCT International Search Report and Written Opinion dated Nov. 30, 2018 for International Application No. PCT/US2018/028821; 12 pages.
U.S. Non-Final Office Action dated Jan. 24, 2019 for U.S. Appl. No. 15/606,358; 27 pages.
Response to Final Office Action dated Jun. 15, 2018 for U.S. Appl. No. 13/946,417, filed Nov. 14, 2018; 14 Pages.
Response filed on Nov. 14, 2018 for Japanese Application No. 2015-511491 with English Translation; 11 Pages.
Response filed on Nov. 14, 2018 for Japanese Application No. 2017-178549 with English Translation; 13 Pages.
Notice of Allowance dated Apr. 16, 2019 for Japanese Application No. 2017-178549 with English Translation of Allowed claims; 8 Pages.
Office Action dated Mar. 22, 2019 for Chinese Application No. 201480040243.6 with English Translation; 22 Pages.
Response to Non-Final Office Action dated Jan. 24, 2019 for U.S. Appl. No. 15/606,358, filed Apr. 17, 2019; 12 Pages.
Response to Final Office Action dated Oct. 25, 2018 for U.S. Appl. No. 15/709,739, filed Jan. 18, 2019; 10 Pages.
U.S. Non-Final Office Action dated Feb. 7, 2019 for U.S. Appl. No. 13/946,417; 35 pages.
Response to U.S. Non-Final Office Action dated Oct. 5, 2018 for U.S. Appl. No. 16/029,826; Response filed Feb. 1, 2019; 10 pages.
Final Office Action dated Oct. 25, 2018 for U.S. Appl. No. 15/709,739; 14 Pages.
Second Office Action dated Oct. 9, 2018 for Chinese Application No. 201480040243.6 with English Translations; 23 Pages.
Non-Final Office Action dated Mar. 8, 2019 for U.S. Appl. No. 15/709,739; 15 Pages.
Response filed on Mar. 14, 2019 for Japanese Application No. 2015-511491 with English Machine Translation; 12 Pages.
Japanese Office Action dated Dec. 17, 2018 for Japanese Application No. 2015-511491; 10 pages.
Chinese Response (w/English Claims and Remarks) filed Dec. 24, 2018 for Chinese Application No. 201480040243.6; 14 pages.
Response to U.S. Non-Final Office Action dated Feb. 7, 2019 for U.S. Appl. No. 13/946,417; Response filed Apr. 22, 2019; 14 pages.
Japanese Notice of Allowance (with English Translation of Allowed Claims) dated May 16, 2019 for Japanese Application No. 2015-511491; 6 Pages.
Response (with English Translation & Amended Claims) to Chinese Office Action dated Mar. 22, 2019 for Chinese Application No. 201480040243.6; Response filed on Jun. 6, 2019; 17 Pages.
Response to U.S. Non-Final Office Action dated Mar. 8, 2019 for U.S. Appl. No. 15/709,739; Response filed Jun. 10, 2019; 15 Pages.
U.S. Non-Final Office Action dated Jun. 13, 2019 for U.S. Appl. No. 15/606,332; 24 Pages.
Response to Office Action and Request for Continued Examination (RCE) filed Feb. 7, 2020 for U.S. Appl. No. 15/606,332; 19 pages.
Examination Report dated Jan. 27, 2020 for European Application No. 14742423.8; 10 pages.
Communication pursuant to Rules 161(1) and 162 EPC dated Jan. 10, 2020 for European Application No. 18726263.9; 3 pages.
Communication pursuant to Rules 161(1) and 162 EPC dated Jan. 10, 2020 for European Application No. 18723635.1; 3 pages.
Communication pursuant to Rules 161(1) and 162 EPC dated Jan. 10, 2020 for European Application No. 18723644.3; 3 pages.

(56) References Cited

OTHER PUBLICATIONS

Response with English Translation and with Amended Claims in English to Chinese Office Action dated Sep. 3, 2019 for Chinese Application No. 2014800402436; Response filed on Dec. 17, 2019; 17 Pages.
PCT International Preliminary Report dated Dec. 5, 2019 for International Application No. PCT/US2018/028475; 11 Pages.
PCT International Preliminary Report dated Dec. 5, 2019 for International Application No. PCT/US2018/028816; 18 Pages.
PCT International Preliminary Report dated Dec. 5, 2019 for International Application No. PCT/US2018/028821; 8 Pages.
Chinese Notice of Grant (with English Translation and Allowed Claims) dated Jan. 9, 2020 for Chinese Application No. 201480040243.6; 11 Pages.
Response to Office Action dated Jan. 17, 2020 for U.S. Appl. No. 16/029,826; 14 pages.
Non-Final Office Action dated Aug. 22, 2019 for U.S. Appl. No. 15/606,358; 32 Pages.
Response to Office Action dated Jun. 13, 2019 for U.S. Appl. No. 15/606,332, filed Aug. 26, 2019; 18 Pages.
Chinese Decision on Rejection (with English Translation) dated Sep. 3, 2019 for Chinese Application No. 201480040243.6; 23 Pages.
U.S. Final Office Action dated Sep. 19, 2019 for U.S. Appl. No. 15/709,739; 24 Pages.
U.S. Final Office Action dated Sep. 19, 2019 for U.S. Appl. No. 16/029,826; 22 Pages.
Response to U.S. Final Office Action dated Sep. 19, 2019 for U.S. Appl. No. 16/029,826; Response filed Oct. 21, 2019; 12 Pages.
U.S. Notice of Allowance dated Sep. 11, 2019 for U.S. Appl. No. 13/946,417; 10 Pages.
U.S. Appl. No. 16/856,582, filed Apr. 23, 2020, David et al.
U.S. Non-Final Office Action dated Nov. 29, 2019 for U.S. Appl. No. 16/029,826; 30 Pages.
Response to U.S. Non-Final Office Action dated Aug. 22, 2019 for U.S. Appl. No. 15/606,358; Response filed Dec. 4, 2019; 20 Pages.
U.S. Final Office Action dated Nov. 27, 2019 for U.S. Appl. No. 15/606,332; 29 Pages.
U.S. Supplemental Notice of Allowability dated Oct. 2, 2019 for U.S. Appl. No. 13/946,417; 7 Pages.
U.S. Non-Final Office Action dated Apr. 2, 2020 for U.S. Appl. No. 15/606,332; 35 Pages.
U.S. Final Office Action dated Mar. 6, 2020 for U.S. Appl. No. 15/606,358; 43 Pages.
Appeal Brief filed on Mar. 19, 2020 for U.S. Appl. No. 15/709,739; 18 Pages.
U.S. Notice of Allowance dated Mar. 23, 2020 for U.S. Appl. No. 16/029,826; 13 Pages.
Response (with Amended Claims) to European Examination Report dated Jan. 27, 2020 for European Application No. 14742423.8; Response Filed May 27, 2020; 10 Pages.
European Examination Report dated May 15, 2020 for European Application No. 16193227.2; 8 Pages.
Response to U.S. Non-Final Office Action dated Apr. 2, 2020 for U.S. Appl. No. 15/606,332; Response filed Jun. 15, 2020; 20 Pages.
Notice of Allowance dated Apr. 4, 2018 for U.S. Appl. No. 13/946,400; 11 pages.
Response to European Rules 161/162 Communication dated Jan. 10, 2020 for European Application No. 18723635.1; Response filed Jul. 17, 2020; 18 Pages.
Response to European Rules 161/162 Communication dated Jan. 10, 2020 for European Application No. 18726263.9; Response filed Jul. 10, 2020; 18 Pages.
Response to U.S. Final Office Action dated Mar. 6, 2020 for U.S. Appl. No. 15/606,358; Response filed Jul. 1, 2020; 16 Pages.
U.S. Non-Final Office Action dated Jul. 28, 2020 for U.S. Appl. No. 15/709,739; 19 Pages.
Response (with Amended Claims) to European 161/162 Communication dated Jan. 10, 2020 for European Application No. 18723644.3; Response Filed Jul. 17, 2020; 15 Pages.
Final Office Action dated Sep. 17, 2020 for U.S. Appl. No. 15/606,332; 21 pages.

\* cited by examiner

MAGNETIC FIELD SENSOR WITH ERROR CALCULATION

FIELD

This disclosure relates to magnetic field sensors and, more particularly, to magnetic field sensors with error calculation.

BACKGROUND

Magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensor may also detect distance to an object. For example, a magnetic field sensor may be used to detect the position of a hydraulic piston.

No magnetic field sensor is perfectly precise. Every magnetic field sensor that detects the position of a target includes at least some error. In some systems, the error may be a nonlinear error that is a function of the position of the target. Compensating for an error that is a function of the position of the target may pose challenges if the target is used as a reference and/or if the position of the target is unknown when attempting to measure and calculate the error.

SUMMARY

In an embodiment, a system includes at least one coil configured to generate a first magnetic field having a first frequency that induces a first reflected magnetic field in a conductive target during a first time period, wherein the first reflected magnetic field has a first magnetic field strength. The coil may be configured to generate a second magnetic field having a second frequency that induces a second reflected magnetic field in a conductive target during a second time period, wherein the second reflected magnetic field has a second magnetic field strength that is different than the first magnetic field strength.

At least one first magnetic field sensing element may be configured to detect the first magnetic field and the first reflected magnetic field during the first time period and to detect the second magnetic field and the second reflected magnetic field during the second time period.

At least one second magnetic field sensing element may be configured to detect the first magnetic field and the first reflected magnetic field during the first time period and to detect the second magnetic field and the second reflected magnetic field during the second time period.

A processing circuit may be coupled to receive a respective output signal from the at least one first and at least one second magnet field sensing elements and calculate an error value of the system.

One or more of the following features may be included.

The second frequency may be substantially zero and the second reflected magnetic field strength may be substantially zero.

The first magnetic field may comprise a first frequency that induces eddy currents in the conductive target that generate the first reflected field.

The error value may be based on measurements taken during the first time period and the processing circuit may be configured to apply the error value to measurements taken during the second time period.

The at least one first magnetic field sensing elements may be placed so that its axis of maximum sensitivity is aligned the first magnetic field.

In another embodiment, a system includes: at least one coil configured to generate a first magnetic field having a first non-zero frequency and generate a second magnetic field having a second frequency; a conductive target positioned to generate a reflected magnetic field in response to the first magnetic field; one or more magnetic field sensing elements configured to produce a first signal representing detection of the first magnetic field and the reflected magnetic field produce a second signal representing detection of the second magnetic field.

One or more of the following features may be included.

A processing circuit may receive the first and second signals and calculate an error value of the system as a function of the first and second signals.

The calculated error value may be independent of a position of the conductive target.

The first magnetic field may have a frequency sufficiently high to induce an eddy current in the conductive target.

The reflected magnetic field may be produced by the eddy current.

The second frequency may be substantially low so that it does not induce a reflected field from the conductive target.

The second frequency may be substantially zero.

The first magnetic field may be generated during a first time period and the second magnetic field may be generated during a second time period.

A processing circuit may calculate an error value based on measurements taken during the second time period and apply the error value to measurements taken during the first time period.

The first and second time periods may be non-overlapping time periods.

In another embodiment, a method comprises: generating a first magnetic field having a first, non-zero frequency; generating a second magnetic field having a second frequency; inducing, by the first magnetic field, a reflected magnetic field from a conductive target; producing a first signal, by one or more magnetic field sensing elements, representing the first magnetic field and the reflected magnetic field; and producing a second signal, by the one or more magnetic field sensing elements, representing the second magnetic field.

One or more of the following features may be included.

An error value may be calculated as a function of the first and second signals.

The calculated error value may be independent of a position of the conductive target.

The first magnetic field may have a frequency sufficiently high to induce an eddy current in the conductive target, wherein the reflected magnetic field is produced by the eddy current.

The second frequency may be substantially low so that the second magnetic field does not induce a reflected magnetic field from the conductive target.

The second frequency may be substantially zero.

Generating the first magnetic field may comprise generating the first magnetic field during a first time period, and generating the second magnetic field may comprise generating the second magnetic field during a second time period, wherein the first and second time periods do not overlap.

The first and second time periods may be non-overlapping time periods.

The first signal may be generated during the first time period; the second signal may be generated during the second time period; An error value may be calculated based on the first signal measured during the first time period; and the error value may be applied to the second signal during the second time period.

In another embodiment, a system comprises a first magnetic field sensing element; a second magnetic field sensing element; means for generating a first magnetic field having a first non-zero frequency; means for generating a second magnetic field having a second frequency; a conductive target positioned to generate a reflected magnetic field in response to the first magnetic field; means for producing a first signal representing the first magnetic field and the reflected magnetic field during a first alternating time period; means for producing a second signal representing the second magnetic field during a second alternating time period; means for calculating an error value as a function of the first and second signals, wherein the error value is based, at least in part, on the second signal during the first time period; and means for applying the error value to the first signal during the first alternating time period.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
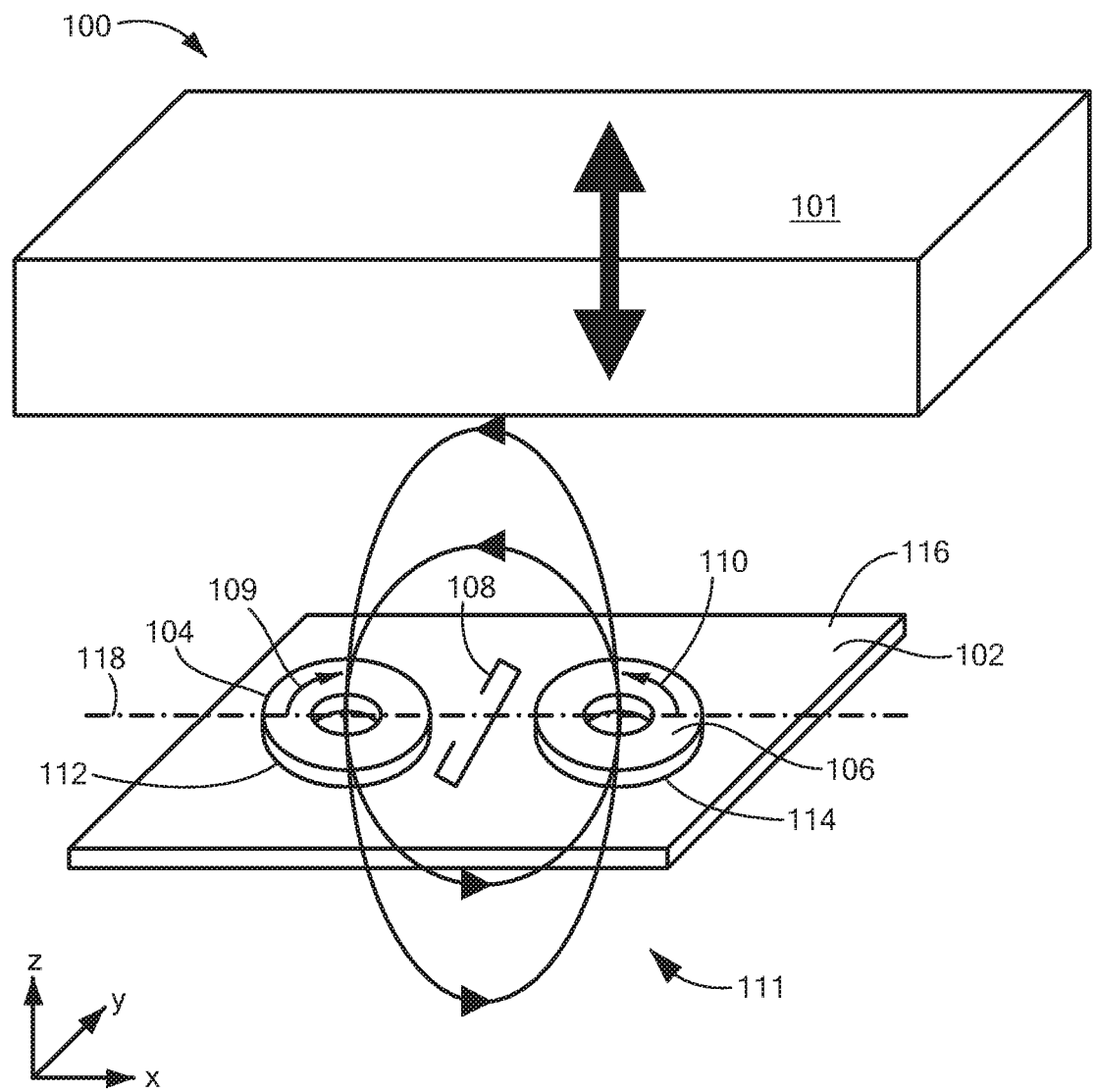
FIG. 1 is a perspective view of a system for sensing a conductive target.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance (MR) elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

FIG. 1 is a perspective view of a system 100 for detecting a conductive target 101. System 100 may include a substrate 102, which may support coil 104, coil 106, and MR element 108. Although one MR element is shown, MR element 108 may comprise two or more MR elements depending on the embodiment of system 100. In other embodiments, coils 104 and 106 may be supported by separate substrates, or may be free-standing coils (i.e. coils that are not supported by a substrate or that are supported by a different structure such as a chip package or frame).

Target 101 may comprise a conductive material, such as a metal, that allows the magnetic fields produced by coils 104 and 106 to induce eddy currents in target 101.

Although not shown, an MR driver circuit may provide current to MR element 108 and coil driver circuit 110 may provide current to coils 104 and 106.

Coil 104 and 106 may be arranged so that the current flows through coils 104 and 106 in opposite directions, as shown by arrow 109 (indicating a clockwise current in coil 104) and arrow 110 (indicating a counterclockwise current in coil 106). As a result, coil 104 may produce a magnetic field having a magnetic moment in the negative Z direction (i.e. down, in FIG. 1), as indicated by arrow 112. Similarly, coil 106 may produce a magnetic field having a magnetic moment in the opposite direction, the positive Z direction, as indicated by arrow 114. An aggregate magnetic field 111 produced by both coils may have a shape similar to that shown by magnetic field lines 111. It will be appreciated that coils 104, 106 may be formed by a single coil structure respectively wound so that the current through the coils flows in opposite directions. Alternatively, coils 104, 106 may be formed by separate coil structures.

In an embodiment, MR element 108 may be positioned between coils 104 and 106. In this arrangement, absent any other magnetic fields aside from those produced by coils 104 and 106, the net magnetic field at MR element 108 may be zero. For example, the negative Z component of the magnetic field produced by coil 104 may be canceled out by the positive Z component of the magnetic field produced by coil 106, and the negative X component of the magnetic field shown above substrate 102 may be canceled out by the positive X component of the magnetic field shown below substrate 102. In other embodiments, additional coils may be added to substrate 102 and arranged so that the net magnetic field at MR element 108 is substantially nil.

To achieve a substantially zero magnetic field at the location of MR element 108, coil 104 and coil 106 may be placed so that current through the coils flows in circular patterns substantially in the same plane. For example, the current through coil 104 and 106 is flowing in circular patterns through the coils. As shown, those circular patterns are substantially coplanar with each other, and with the top surface 116 of substrate 102.

A coil driver (not shown in FIG. 1) coupled to coil 104 and/or 106 may produce an alternating field. In this arrangement, the magnetic field shown by magnetic field lines 111 may change direction and magnitude over time. However, during these changes, the magnetic field at the location of MR element 108 may remain substantially nil.

In operation, as target 101 moves toward and away from MR element 108 (i.e. in the positive and negative Z direction), magnetic field 111 will cause eddy currents to flow within target 101. These eddy currents will create their own magnetic fields, which will produce a non-zero magnetic field in the plane of the MR element 108, which non-zero magnetic field can be sensed to detect the motion or position of target 101.

Figure 2:
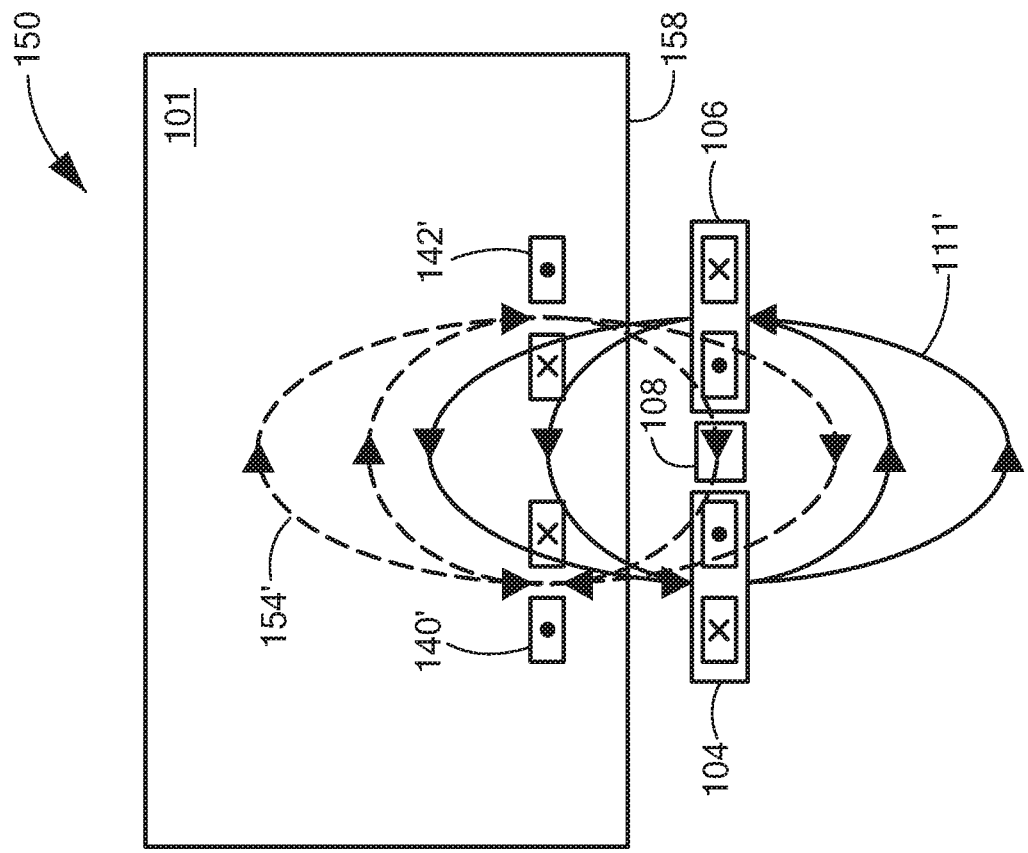
FIG. 2 are cross sectionals view of the system of FIG. 1.
Figure 2:
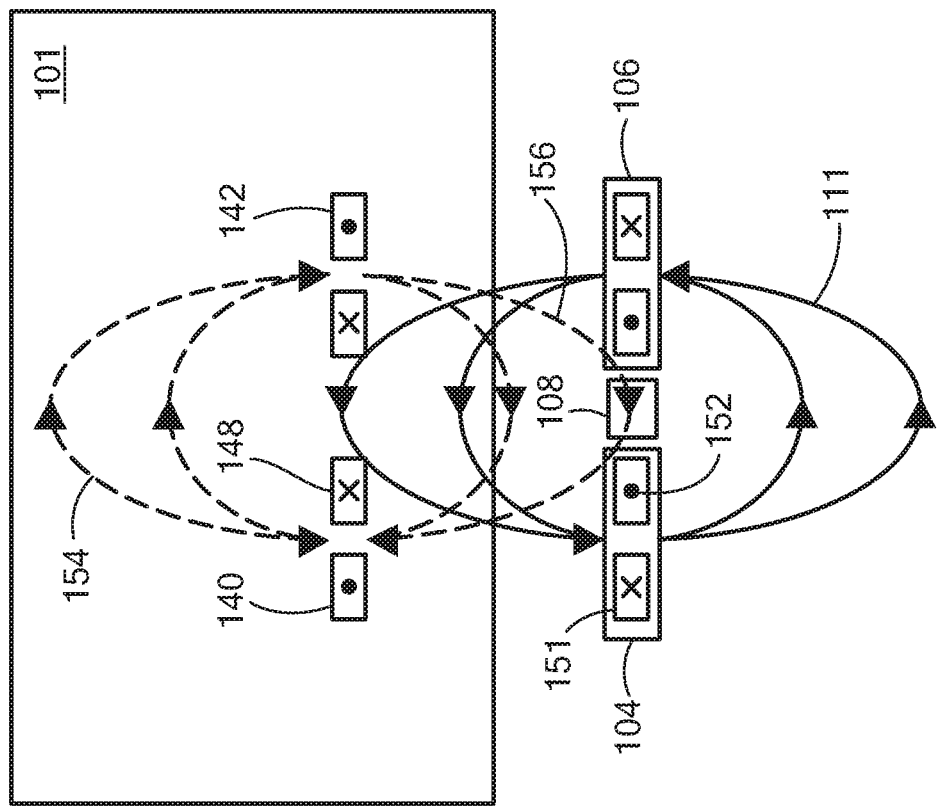

Referring to FIG. 2, a cross-sectional view 150 of system 100, as viewed at line 118 (in FIG. 1) in the Y direction, illustrates the eddy currents within target 101. The 'x' symbol represents a current flowing into the page and the ⋅ symbol represents a current flowing out of the page. As noted above, the current through coils 104 and 106 may be an alternating current, which may result in an alternating strength of magnetic field 111. In embodiments, the phase of the alternating current through coil 104 matches the phase of the alternating current through coil 106 so that magnetic field 111 is an alternating or periodic field.

Alternating magnetic field 111 may produce eddy currents 140 and 142 within magnetic target 101. Eddy currents 140 and 142 may be opposite in direction to the current flowing through coils 104 and 106, respectively. As shown, eddy current 148 flows out of the page and eddy current 140 flows into the page, while coil current 151 flows into the page and current 152 flows out of the page. Also, as shown, the direction of eddy current 142 is opposite the direction of the current through coil 106.

Eddy currents 140 and 142 generate a reflected magnetic field 154 that has a direction opposite to magnetic field 111. As noted above, MR element 108 detects a net magnetic field of zero due to magnetic field 111. However, MR element 108 will detect a non-zero magnetic field in the presence of reflected magnetic field 154. As illustrated by magnetic field line 156, the value of reflected magnetic field 154 is non-zero at MR element 108.

As target 101 moves closer to coils 104 and 106, magnetic field 111 may produce stronger eddy currents in target 101. As a result, the strength of reflected magnetic field 154 may change. Magnetic field 111' (in the right-hand panel of FIG. 2) may represent a stronger magnetic field than magnetic field 111 due, for example, to the closer proximity of target 101 to coils 104 and 106. Thus, eddy currents 140' and 142' may be stronger currents than eddy currents 140 and 142, and magnetic field 154' may be stronger than magnetic field 154. This phenomenon may result in MR element 108 detecting a stronger magnetic field (i.e. magnetic field 154') when target 101 is closer to coils 104 and 106, and a weaker magnetic field (i.e. magnetic field 154) when target 101 is further away from coils 104 and 106.

Also, eddy currents 140' and 142' generally occur on or near the surface of target 101. Magnetic field strength diminishes as a function of radius—i.e. as a function of distance from the source of the magnetic field. Therefore, as target 101 moves closer to MR element 108, MR element 108 may experience a stronger magnetic field from the eddy currents because the source of the magnetic field is closer to MR element 108.

Figure 3:
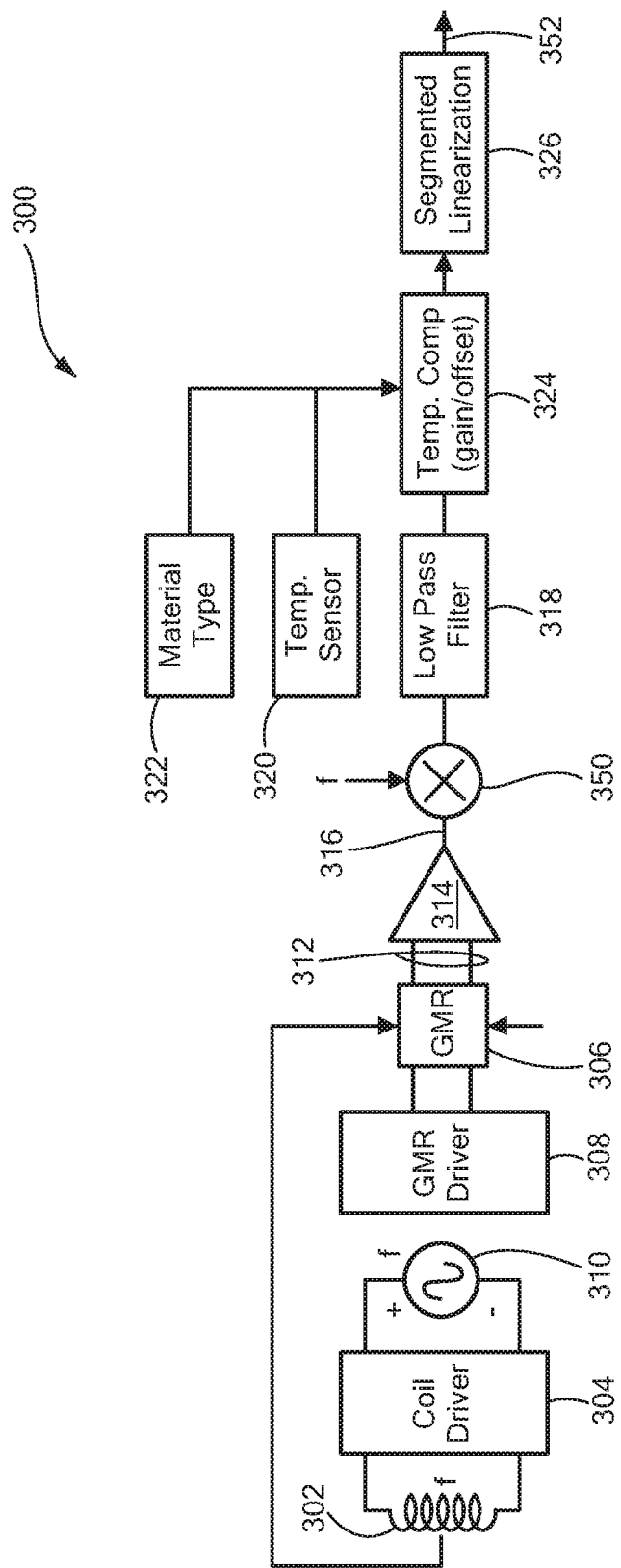
FIG. 3 is a block diagram of a system for sensing a conductive target, including signal processing elements.

FIG. 3 is a block diagram of a magnetic field sensor 300, which may include coil 302, coil driver 304, AC driver 310, MR driver 308, MR element 306, amplifier 314, low pass filter 318, temperature sensor 320, material type module 322, offset module 324, and segmented linearization module 326.

Although shown as a single coil, coil 302 may comprise one or more coils. In embodiments, coil 302 may be the same as or similar to coil 104 and/or coil 106 described above. Similarly, MR element 306 may comprise one or more MR elements and may be the same as or similar to MR element 108 described above.

Coil driver 304 may provide a power signal that drives current through coil 302, thus causing coil 302 to generate a magnetic field. MR driver 308 may provide power to MR elements 306, allowing them to detect magnetic fields.

MR element 306 may be responsive to a sensing element drive signal (e.g. the signal produced by MR driver 308) and may be configured to detect a directly-coupled magnetic field generated by coil 302. MR element 306 may produce signal 312, representing the detected magnetic field. MR element 306 may also be configured to detect a reflected magnetic field produced by eddy currents within a target, such as target 101.

As shown, AC driver 310 is coupled to coil driver 304. In this embodiment, coil driver 304 may produce a low-frequency signal to drive coil 302. The frequency may be low enough so that the magnetic field produced by coil 302 does not induce eddy currents and a reflected field from target 101. In some embodiments, the frequency is zero (i.e. a "DC" frequency).

Coil 302 may produce a DC (or substantially low frequency AC) magnetic field that can be detected by MR element 306, but which does not produce eddy currents in the target. The signal produced by detection of the DC (or substantially low frequency AC) magnetic field may be used to adjust sensitivity of the magnetic field sensor.

Coil 302 may also produce an AC magnetic field at higher frequencies that induces eddy currents in the target, which produce a reflected magnetic field at those higher frequencies that can be detected by MR element 306. Coil 302 may alternate between producing the low frequency magnetic field and the high frequency magnetic field.

MR element 306 may produce signal 312, which may include frequency components at DC or substantially low AC frequency (e.g. a "directly coupled" signal or signal component) representing the lower frequency magnetic field that does not cause eddy currents in the target, and/or frequency components at the higher AC frequency (e.g. a "reflected" signal or signal component) that represent the detected reflected field. In embodiments, the directly coupled signals may be used to adjust sensitivity of the sensor while the reflected signals may be used to detect the target. Coil driver 304 and/or MR driver 308 may use the directly coupled signals as a sensitivity signal adjust their respective output drive signals in response to the sensitivity signal.

In embodiments, the directly coupled signal and the reflected signal may be included as frequency components of the same signal. In this case, coil 302 may be driven to produce both frequency components at the same time. In other embodiments, generation of the directly coupled signal and the reflected signals may be generated at different times, for example using a time-division multiplexing scheme.

Sensor 300 may also include a demodulator circuit 350 that can modulate signal 316 to remove the AC component from the signal or shift the AC component within the signal to a different frequency. For example, demodulator circuit 350 may modulate signal 316 at frequency f. As known in the art, because signal 316 includes signal components at frequency f representing the detected magnetic field, modulating signal 316 at frequency f may shift the signal elements representing the detected magnetic field to 0 Hz or DC. Other frequency components within signal 316 may be shifted to higher frequencies so they can be removed by low-pass filter 318. In embodiments, the DC or low frequency component of signal 316, which may represent a sensitivity value, can be fed back to coil driver 304 to adjust the output of coil 302 in response to the signal, and/or to MR driver 308 to adjust drive signal 309 in response to the sensitivity value. DC output signal 352 may represent proximity of the target to MR element 306.

In other embodiments, a time-division multiplexing scheme may be used. For example, coil driver 304 may drive coil 302 at a first frequency during a first time period, at a second frequency during a second time period, etc. In some instances, the first and second (and subsequent) time periods do not overlap. In other instances, the first and second time periods may overlap. In these instances, coil driver 304 may drive coil 302 at two or more frequencies simultaneously. When the first and second time periods do not overlap, demodulator 350 may operate at the same frequency as the coil driver 304. When the time periods overlap, multiple modulators can be used, the first running at the first frequency, and the second running at the second frequency to separate out the signals at each frequency.

While it can be advantageous to reduce the directly coupled magnetic field that the MR element 306 detects to achieve an accurate read of the reflected field (and thus the detected target), it may also be advantageous to have some amount of direct coupling (i.e., to directly detect the magnetic field produced by coil 302) to permit a sensitivity value to be computed. The simultaneous measure of both the field reflected by the target and the field directly generated by the coil allows accurate detection of the distance of the object independent of the sensitivity of the MR elements, coil drive current, etc. The sensitivity of MR elements may vary with temperature and/or with the presence of unwanted DC or AC stray fields in the plane of the MR array. The ratio between the reflected field and the directly coupled field is just dependent on geometrical design and is hence a good parameter to accurately determine a distance.

In embodiments, a frequency hopping scheme may be used. For example, coil driver 304 may drive coil 302 at different frequencies (e.g. alternate between frequencies over time, or produce a signal containing multiple frequencies). In such embodiments, sensor 300 may include multiple demodulator circuits and/or filters to detect a signal at each frequency.

Additional examples of magnetic field sensors that use a coil and reflected field may be found in U.S. Patent Application entitled COIL ACTUATED POSITION SENSOR WITH REFLECTED MAGNETIC FIELD, which lists Mr. A. Latham as an inventor, is commonly owned with this application, was filed on the same day as this application, was assigned U.S. application Ser. No. 15/606,358, and which is incorporated here by reference in its entirety.

Figure 4:
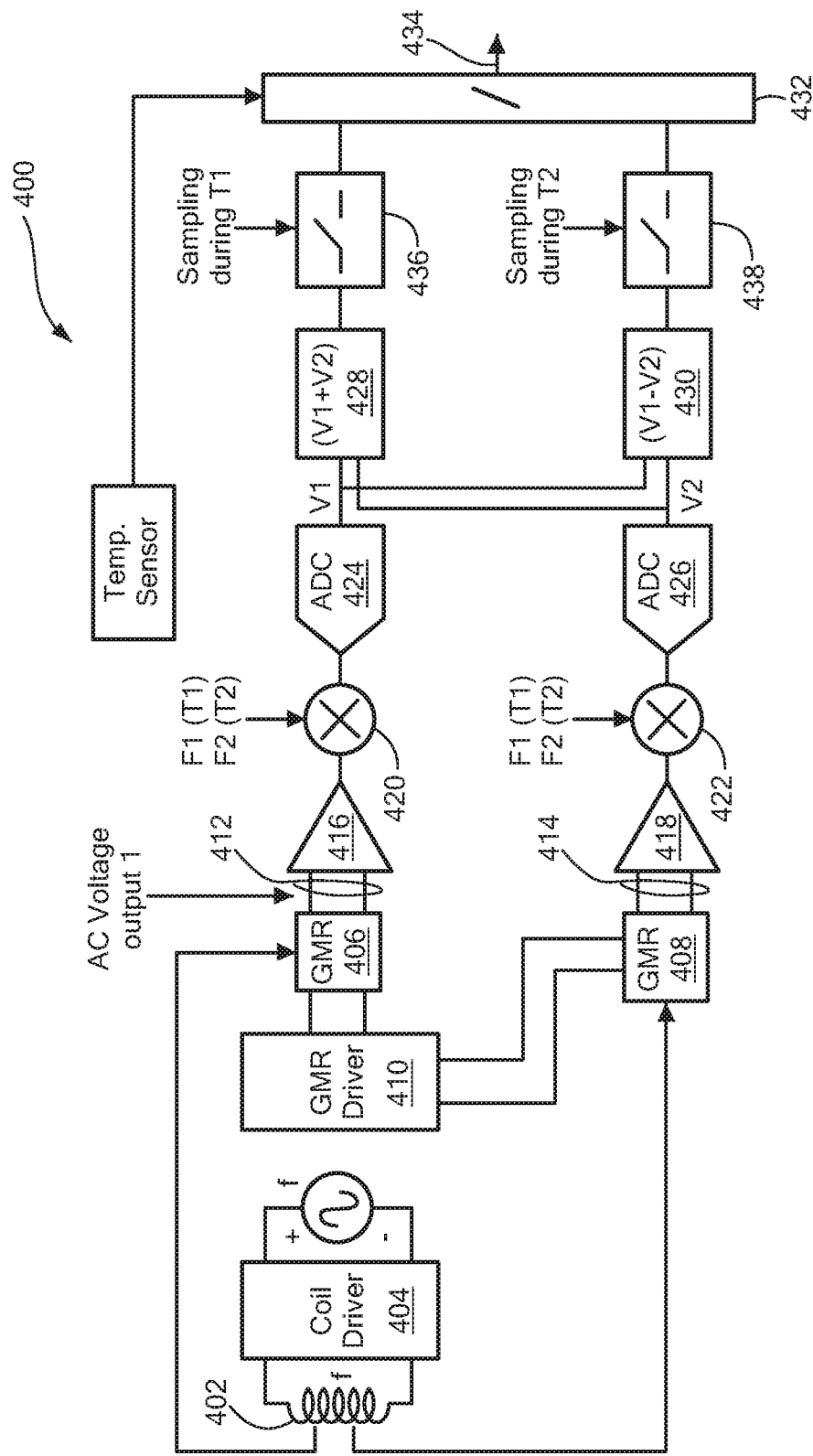
FIG. 4 is a block diagram of another embodiment of a system for sensing a conductive target, including signal processing elements.

FIG. 4 is a block diagram of a magnetic field sensor 400 for detecting a conductive target. Magnetic field sensor 400 includes coil 402 for generating a magnetic field, coil driver 404 to drive current through coil 402, and magnetic field sensing elements 406 and 408 to detect magnetic fields. Coil driver 404 may be an adjustable coil driver that can drive current of different magnitude and different frequency through coil 402. For example, coil driver 404 may drive an AC current having a first frequency during a first time period, and a current with second frequency during a second time period. In embodiments, the first frequency may be high enough to produce eddy currents in, and a reflected magnetic field from, the conductive target, and the second frequency may be low enough so that any reflected field from the conductive target is substantially undetectable by magnetic field sensing elements 406 and 408. In embodiments, the second frequency may be a zero-frequency or "DC" frequency.

Magnetic field sensing elements 406 and 408 may be MR elements, Hall effect elements, or other types of magnetic field sensing element. In embodiments, magnetic field sensing elements 406 and 408 shown in FIG. 4 may represent multiple Hall effect or MR elements. For example, each block 406 and 408 may represent two, four, or more magnetic field sensing elements arranged in a bridge formation to produce differential output signals 412 and 414, respectively. In other embodiments, magnetic field sensing elements 406 and 408 may produce single ended output signals.

Magnetic field sensing elements 406 and 408 may detect a directly coupled magnetic field (i.e. they may directly detect the magnetic field produced by coil 402), and may detect a reflected field produced by eddy currents in the conductive target (e.g. target 101 in FIG. 1). In embodiments, magnetic field sensing elements 406 and 408 may be arranged so that their axes of maximum sensitivity are in opposite directions. For example, when sensing the directly coupled field, MR element 406 may produce a signal having the same absolute value, but opposite sign to the signal produced by MR element 408. The axes of maximum sensitivity may also be arranged so that the signals produced when MR elements 406 and 408 detect the reflected magnetic field do not have opposite signs. In embodiments, this may be effectuated by including a counter-coil in coil 402.

Figure 4A:
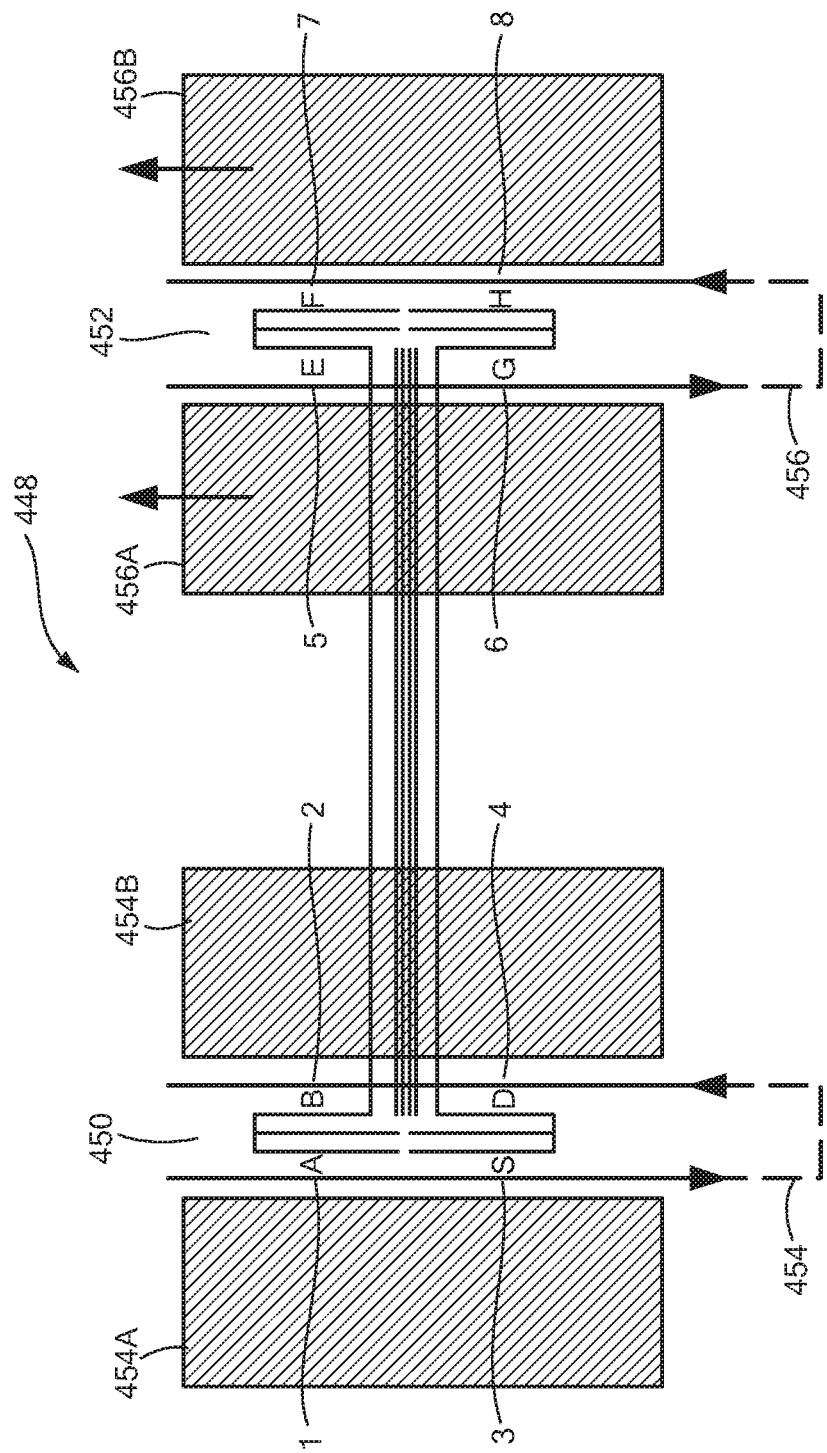
FIG. 4A is a schematic diagram of a coil an magnetic field sensing elements.

Referring to FIG. 4A, coil 448 may be the same as or similar to coil 402. MR elements 1-4 may comprise or may be the same as or similar to MR element 406, and MR elements 5-8 may comprise or may be the same as or similar to MR element 408. For example, MR elements 1-4 may form an MR bridge that is the same as or similar to MR element 406, and MR elements 5-8 may form an MR bridge that is the same as or similar to MR element 408.

Coil 452 may include traces 454A, 454B, 456A, and 456B, and countercoil portions 454 and 456. The countercoil portions 454 and 456 may produce a local magnetic field around MR elements that reduces the response of MR elements 1-8 to the reflected magnetic field and increases the response of MR elements 108 to the directly coupled field. The local magnetic field produced by countercoil portions 454 and 456 may have a direction opposite to that of the magnetic field produced by traces 454A, 454B, 456A, and 456B.

In FIG. 4A, current through countercoil portions 454 and 456 is shown to travel in a counterclockwise direction. Although not shown, in other embodiments, current through countercoil portions 454 and 456 may travel in a counterclockwise direction.

The differential output of the bridge comprising MR elements 1-4 may be defined as the voltage at the series connection node between MR elements 1 and 4 less the voltage at the series connection node between MR elements 2 and 3, and the differential output of the bridge comprising MR elements 5-8 may be defined as the voltage at the series connection node between MR elements 5 and 8 less the voltage at the series connection node between MR elements 6 and 7. Considering the case where there is no reflected field, the directly coupled field experienced by MR elements 1 and 4 may be opposed to the directly coupled field experienced by MR elements 2 and 3. In other words, the MR elements may be positioned so that the resistance of MR elements 1 and 3 may increase and the resistance of MR elements 2 and 4 may decrease as they experience a stronger directly coupled magnetic field. Also, MR elements may be positioned so the resistance of MR elements 5 and 7 may increase and the resistance of MR elements 6 and 8 may decrease as they experience a stronger directly coupled magnetic field.

Considering now the situation where a target and reflected field are present, despite the countercoils 454 and 456, the MR elements 1-8 may experience the reflected field as a uniform field that is common to both bridges. Thus, the reflected field may cause the differential output of the bridge comprising MR elements 1-4 to shift in the same direction as the differential output of the bridge comprising MR elements 5-8. This, the reflected field component can be distinguished from the directly coupled field component of the outputs of the MR bridges by summing or subtracting the differential outputs of the MR bridges.

Referring again to FIG. 4, magnetic field sensor 400 may also include signal processing elements such as amplifiers 416 and 418 to amplify signals 412 and 414, modulators 420 and 422, and analog-to-digital converters (ADC) 424 and 426 to process signals 412 and 414. Modulators 420 and 422 may multiply the signal from the MR elements by a frequency that is substantially the same as the frequency of coil driver 404. This may shift the frequency to DC for subsequent processing.

In embodiments, coil driver 402 may drive coil 402 at one frequency (F1) during a first time period and at another frequency (F2) during a second time period. Thus, modulators 420 and 422 may be configured to multiply the signals from the MR elements by frequency F1 during the first time period and by frequency F2 during the second time period. Modulators 420 and 422 may shift the signal to DC by multiplying the signals by the same frequency that drives coil 402.

Magnetic field sensor 400 may also include an MR driver 410 which may provide power to magnetic field sensing elements. MR driver may apply or remove power from either magnetic field sensing element 406 or 408 during alternating time periods. For example, magnetic field sensing element 406 may be active and magnetic field sensing element 408 may be inactive during one time period. During a second time period, magnetic field sensing element 408 may be active and magnetic field sensing element 406 inactive. Alternatively, MR driver may provide power to or remove power from both magnetic field sensing elements 406 and 408 at the same time.

Magnetic field sensor 400 may also include processing circuitry to calculate an error value of the magnetic field sensor. Summation circuit 428 may produce a sum of signal V1 and signal V2. Subtraction circuit 430 may calculate the value V1-V2. Division circuit 432 may divide the signal from summation circuit 428 by the signal from subtraction circuit 430 to produce output signal 434, which may represent the value of (V1+V2)/(V1−V2). Recall that V1 may be a digital representation of signal 412 produced by magnetic field sensing element 406 and signal V2 may be a digital representation of signal 414 produced by magnetic field sensing element 408.

Sampling circuits 436 and 438 may selectively couple the output of summation circuit 428 and subtraction circuit 430 to the inputs of division circuit 432, respectively. For example, in an embodiment, the signal (V1+V2) from summation circuit 428 may be sampled during the first time period and the signal (V1−V2) from subtraction circuit 430 may be sampled during the second time period. Accordingly, division circuit may divide the (V1−V2) factor sampled during the first time period by the (V1+V2) factor sampled during the second time period to produce signal 434.

During operation, magnetic field sensor 400 may alternate states during a first time period and a second time period. During the first time period, coil driver 404 may drive coil 402 with current having a frequency F1. The magnetic field produced by coil 402 may induce eddy currents and a reflected magnetic field at frequency F1. Magnetic field sensing elements 406 and 408 may detect the directly coupled field from coil 402 and the reflected field from the target during the first time period. As noted above, magnetic field sensing elements may be arranged so that magnetic field sensing elements 406 and 408 detect the directly coupled field with opposite sign, and detect the reflected magnetic field with the same sign.

During the first time period, sampling circuit 436 may allow the signal (V1+V2) to pass to division circuit 432, while sampling circuit 438 does not pass the signal (V1−V2) to division circuit 432.

During the second time period, coil driver 404 may drive coil 402 with current having a frequency F2. The magnetic field produced by coil 402 may induce eddy currents and a reflected magnetic field at frequency F2. Magnetic field sensing elements 406 and 408 may detect the directly coupled field from coil 402 and the reflected field from the target during the first time period. In some embodiments, frequency F2 is low enough so that it does not induce significant eddy currents or a reflected magnetic field that can be detected by magnetic field sensing elements 406 and 408. In such an embodiment, magnetic field sensing elements 406 and 408 may detect only the directly coupled field during the second time period.

During the second time period, sampling circuit 438 may allow the signal (V1−V2) to pass to division circuit 432, while sampling circuit 436 does not pass the signal (V1+V2) to division circuit 432.

After the samples taken during the first and second time periods are available, division circuit 432 may calculate output signal 434, representing (V1+V2)/(V1−V2), where (V1+V2) was sampled during the first time period and (V1−V2) was sampled during the second time period. In embodiments where frequency F2 does not induce a reflected magnetic field during the second time period, the term (V1+V2) may represent the directly coupled and reflected magnetic fields, while the term (V1−V2) may represent only the directly coupled magnetic field.

In embodiments, signal 434 may be used to determine an error of magnetic field of magnetic field sensor 400, e.g. a mismatch error between the magnetic field sensing elements. The error may also be based on noise, interference, external magnetic fields, etc. In some cases, for example when magnetic field sensing elements 406 and 408 are detecting a reflected magnetic field from the target, the magnetic field sensor's error may be a function of the position or distance of the target from magnetic field sensing elements 406 and 408, and the frequency and strength of the reflected magnetic field. For example, the portion of the error due to the reflected field (the "reflected field error") may be a non-linear error. By measuring the directly coupled and reflected field at two frequencies, as described above, magnetic field sensor 400 may compensate for the error due to the reflected field.

In the case where the first frequency F1 and second frequency F2 are non-zero, magnetic field sensor 400 may compensate for the reflected field error by extrapolating or interpolating the magnetic field error using the two frequency points. The technique may also be used in the case where F1 is non-zero and F2 is zero, or low enough so that no reflected field is detectable by magnetic field sensors 406 and 408. In this case, the computations that determine the error value may be simplified because, at one of the frequency points, the reflected field strength is zero. For example, in the example above where F2 is zero, the error value (V1−V2) may not be dependent on the reflected field, and thus not dependent on the position of the target, because no reflected magnetic field is present when the error value (V1−V2) is measured.

In a typical system, V1 and V2 may be described by the following formulas:

$$V1 = I(T) * K_1 * S * \left[\left(1 + \frac{S_m}{2}\right) + r(x) * \left(1 + \frac{S_m}{2}\right)\right] \quad (1)$$

$$V2 = I(T) * K_2 * S * \left[q * \left(1 + \frac{S_m}{2}\right) + r(x) * \left(1 + \frac{S_m}{2}\right)\right] \quad (2)$$

where I is the current through coil 402, $K_1$ and $K_2$ are coupling factors of the magnetic field sensing elements 406 and 408, respectively, r(x) is a ration between the reflected field and the directly coupled field, and S is a sensitivity mismatch factor representing a mismatch in sensitivity between magnetic field sensing elements 406 and 408. Note that r(x) may be a function of the position of the target. The value q is a ratio between $K_1$ and $K_2$ such that $K_2 = q*K_1$.

Additionally, the position of the target $P_N$ can be described with the following formula:

$$P_N = \frac{V1 + V2}{V1 - V2} \quad (3)$$

Substituting V1 and V2, the formula for $P_N$ may be rearranged as:

$$P_N = \frac{1 + q + (1-q)*\frac{S_M}{2}}{1 - q + (1 + q + 2*r(x))*\frac{S_M}{2}} + \frac{2*r(x)}{1 - q + (1 + q + 2*r(x))*\frac{S_M}{2}} \quad (4)$$

Formula 4 may be rewritten as:

$$P_N = \text{off} + G*r(x) \quad (5)$$

where:

$$\text{off} = \frac{1 + q + (1-q)*\frac{S_M}{2}}{1 - q + (1 + q + 2*r(x))*\frac{S_M}{2}} \quad (6)$$

$$G = \frac{2}{1 - q + (1 + q + 2*r(x))*\frac{S_M}{2}} \quad (7)$$

If we assume that q=−1 (corresponding to magnetic field sensing elements 406 and 408 detecting the directly coupled magnetic field with opposite signs described above), then formula 4 may be simplified to:

$$P_N = \frac{S_M}{S_M * r(x) + 2} + \frac{2*r(x)}{S_M * r(x) + 2} \quad (8)$$

As an example, if r(x) is 0.5 and $S_M=0.01$ (representing a 1% mismatch between magnetic field sensing elements), formula 8 gives us:

$$P_N = \frac{0.01}{0.01*0.5 + 2} + \frac{2*0.5}{0.01*0.5 + 2} = 0.503 \quad (9)$$

This indicates that, in this example, a 1% mismatch between magnetic field sensing elements correlates to a 0.7% error in the position. Moreover, this error may be a function of the position of the target, as shown in formula 4 above. However, time multiplexing and changing the frequency of the magnetic field during operation and calibration can reduce the error in position.

Figure 5:
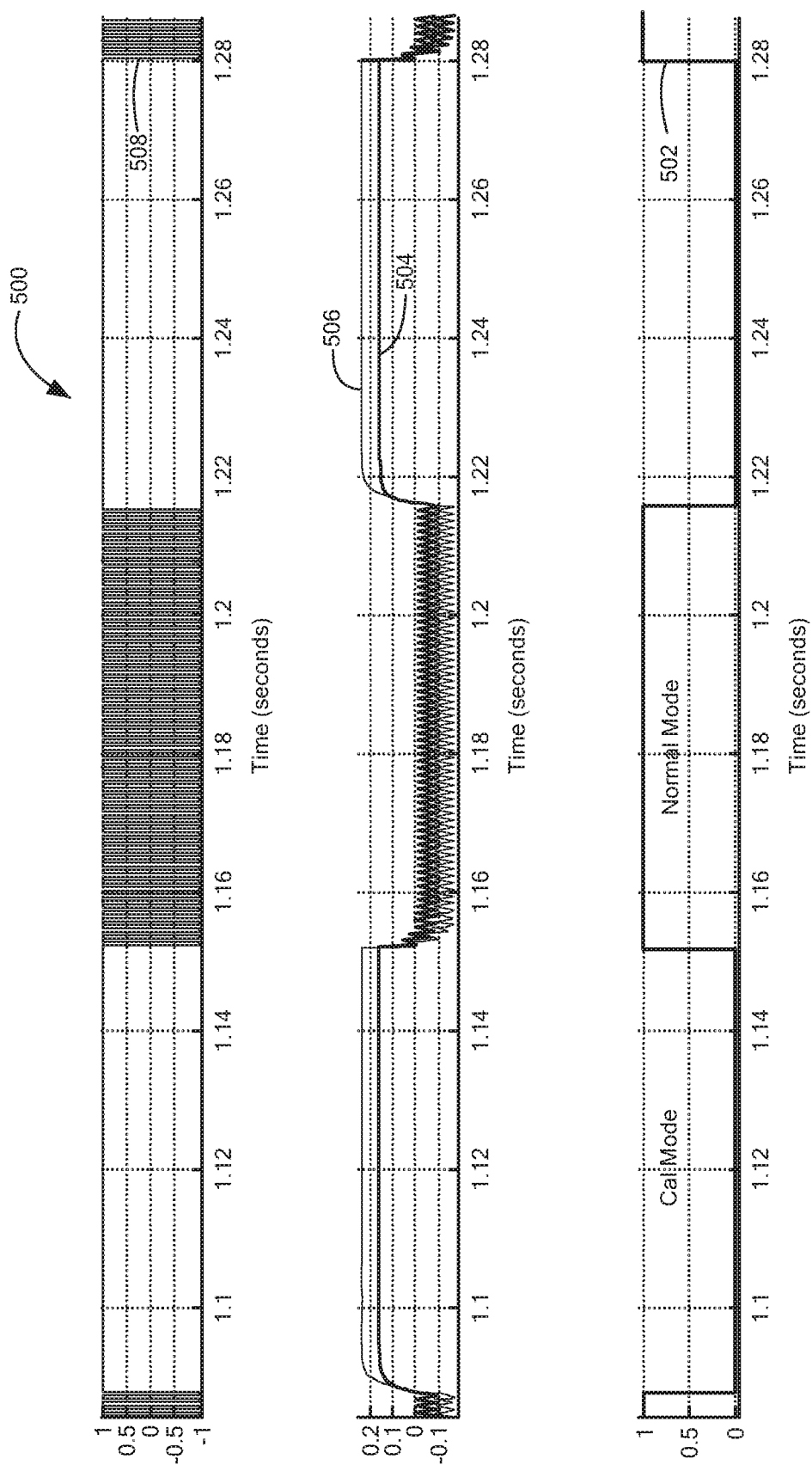
FIG. 5 is a graph of signals associated with the system of FIG. 4.

Referring now to FIG. 5, graph 500 illustrates operation of magnetic field sensor 400 during a calibration ("cal") mode and normal operating mode. Waveform 502 represents a control signal that switches magnetic field sensor system 400 between calibration mode and normal mode. Waveform 504 represents signal V1 and waveform 506 represents signal V2. Signal 508 represents the output of coil driver 404. During calibration mode, waveform 508 is a DC waveform, indicating that the magnetic field produced by coil 402 has a zero frequency. Thus, during calibration mode, the target may not produce a reflected magnetic field. As shown, waveform 504 and 506 (corresponding to signals V1 and V2) may also be DC waveforms.

During calibration mode, the error value (V1−V2) may be calculated, as described above. Because (V1−V2) is calculated during calibration mode, the term (V1−V2) may not include measurements of the reflected magnetic field and may not include errors due to position of the target.

During normal mode, the term (V1+V2) may be calculated, as described above. Because (V1+V2) is calculated during normal mode, the term (V1+V2) may include measurements of the reflected magnetic field and thus may include errors due to position of the target.

In embodiments, magnetic field sensor 400 may alternate operation between calibration mode and normal mode. In other embodiments, because the measurements taken during calibration mode do not depend on the reflected field, magnetic field sensor 400 may operate in calibration mode less frequently than in normal mode. In some embodiments, calibration mode may only be performed once during startup and the term (V1−V2) may be stored and reused during calculation of the system error. In other words:

$$[V1-V2]_{T1} = [V1-V2]_{T2} \tag{10}$$

Where T1 corresponds to the normal mode and T2 corresponds to calibration mode. Using formulas 5 and 10, we can derive:

$$P_N = \frac{[V1+V2]_{T_1}}{[V1-V2]_{T_2}} = \text{off} + G' * r(x) \tag{11}$$

$$\text{off} = \frac{1 + q + (1-q) * \frac{S_M}{2}}{1-q} \tag{12}$$

$$G' = \frac{2}{1-q} \tag{13}$$

The terms off and G' are both independent of r(x), and thus independent of error due to position of the target. Thus, the target position $P_N$ may be calculated without the inclusion of the nonlinearity error due to target position.

Figure 6:
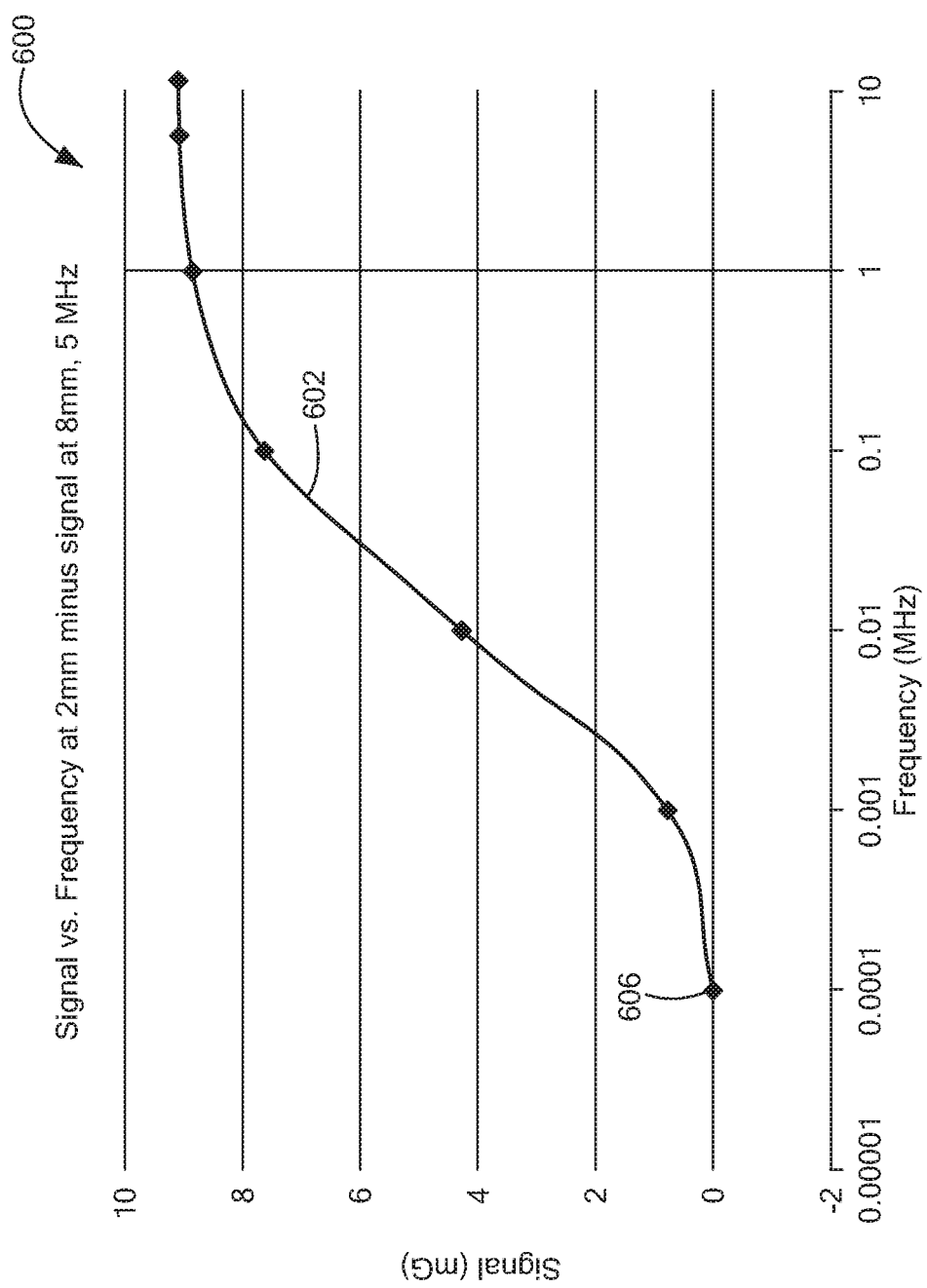
FIG. 6 is a graph of strength of a reflected magnetic field versus frequency.

Referring now to FIG. 6, graph 600 includes a waveform 602 representing detection of the reflected magnetic field versus frequency of the signal driving coil 402. The horizontal axis represents frequency and the vertical axis represents milli-Gauss of reflected magnetic field detected by the magnetic field sensing elements. The frequency may be chosen to be sufficiently low so that during calibration mode the detected reflected field is negligible. In the example shown, a frequency of 0.0001 MHz or less may result zero reflected magnetic field, as shown by point 606. In embodiments, higher frequencies may be used if the resulting reflected magnetic field is negligible or within system tolerances for measuring the system's error.

Figure 7:
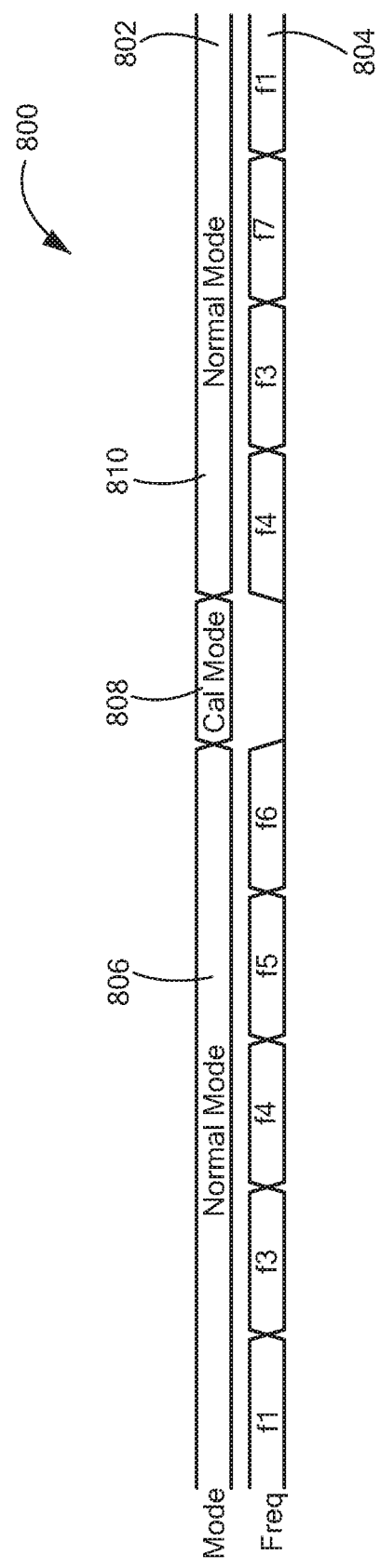
FIG. 7 is a timing graph of modes of operation of the system of FIG. 4.

Referring to FIG. 7, graph 800 illustrates timing between calibration mode and normal mode where different frequencies are used to drive coil 402 during normal mode. If coil 402 is driven at a single frequency, magnetic field sensor may radiate emissions at that frequency. Varying the frequency driving coil 402 during normal mode may, in certain cases, reduce or vary the frequency of radiated emissions of the device.

In FIG. 7, waveform 802 indicates normal mode or calibration mode, and waveform 804 represents the frequency driving coil 402. During the first calibration mode 806, the frequency 804 may switch between f1, f3, f4, f5, f6, etc. During calibration mode 808, coil 402 may be driven by a DC signal, as described above. When the magnetic field sensor again enters a normal operating mode 810, the frequency may switch between f4, f3, f7, f1, etc. In other embodiments, each calibration mode may drive coil 402 at a single frequency, but the frequency may change with each calibration mode. Also, FIG. 8 shows a particular sequence of changing frequencies. However, one skilled in the art will recognize that any sequence or pattern of changing frequencies may be used.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. A system comprising:
   at least one coil configured to:
      generate a first magnetic field having a first frequency that induces a first reflected magnetic field in a conductive target during a first time period, wherein the first reflected magnetic field has a first magnetic field strength; and
      generate a second magnetic field having a second frequency that induces a second reflected magnetic field in the conductive target during a second time period, wherein the second reflected magnetic field has a second magnetic field strength that is different than the first magnetic field strength;
   at least one first magnetic field sensing element configured to detect the first magnetic field and the first reflected magnetic field during the first time period and to detect the second magnetic field and the second reflected magnetic field during the second time period;
   at least one second magnetic field sensing element configured to detect the first magnetic field and the first reflected magnetic field during the first time period and to detect the second magnetic field and the second reflected magnetic field during the second time period; and
   a processing circuit coupled to receive a respective output signal from the at least one first and at least one second magnetic field sensing elements and to calculate an error value of the system,
   wherein the processing circuit to calculate the error value comprises:
      summing the output signal from the at least one first magnetic field sensing elements and the output signal from the at least one second magnetic field sensing elements to form a summation signal; and
      subtracting the output signal from the at least one second magnetic field sensing elements from the output signal from the at least one first magnetic field sensing elements to form a subtraction signal.

2. The system of claim 1 wherein the second frequency is substantially zero and the second reflected magnetic field strength is substantially zero.

3. The system of claim 1 wherein the first magnetic field comprises a first frequency that induces eddy currents in the conductive target that generate the first reflected magnetic field.

4. The system of claim 1 wherein the error value is based on measurements taken during the first time period and the processing circuit is configured to apply the error value to measurements taken during the second time period.

5. The system of claim 1 wherein the at least one first magnetic field sensing element is placed so that its axis of maximum sensitivity is aligned with the first magnetic field.

6. The system of claim 1 wherein the processing circuit to calculate the error value further comprises the processing circuit dividing the summation signal by the subtraction signal.

7. A system comprising:
at least one coil configured to:
generate a first magnetic field having a first non-zero frequency; and
generate a second magnetic field having a second frequency;
a conductive target positioned to generate a reflected magnetic field in response to the first magnetic field;
one or more magnetic field sensing elements configured to:
produce a first signal representing detection of the first magnetic field and the reflected magnetic field; and
produce a second signal representing detection of the second magnetic field; and
a processing circuit configured to:
receive the first and second signals; and
calculate an error value of the system as a function of the first and second signals,
sum the first signal and the second signal to form a summation signal; and
subtract the first signal from the second signal to form a subtraction signal.

8. The system of claim 7 wherein the calculated error value is independent of a position of the conductive target.

9. The system of claim 7 wherein first magnetic field has a frequency sufficiently high to induce an eddy current in the conductive target.

10. The system of claim 9 wherein the reflected magnetic field is produced by the eddy current.

11. The system of claim 7 wherein the second frequency is substantially low so that it does not induce a reflected field from the conductive target.

12. The system of claim 11 wherein the second frequency is substantially zero.

13. The system of claim 7 wherein the first magnetic field is generated during a first time period and the second magnetic field is generated during a second time period.

14. The system of claim 13 further comprising a processing circuit to calculate an error value based on measurements taken during the second time period and apply the error value to measurements taken during the first time period.

15. The system of claim 13 wherein the first and second time periods are non-overlapping time periods.

16. The system of claim 7 wherein the processing circuit configured to calculate the error value further comprises the processing circuit configured to divide the summation signal by the subtraction signal.

17. A method comprising:
generating a first magnetic field having a first, non-zero frequency;
generating a second magnetic field having a second frequency;
inducing, by the first magnetic field, a reflected magnetic field from a conductive target;
producing a first signal, by one or more magnetic field sensing elements, representing the first magnetic field and the reflected magnetic field;
producing a second signal, by the one or more magnetic field sensing elements, representing the second magnetic field; and
calculating an error value as a function of the first and second signals,
summing the first signal and the second signal to form a summation signal; and
subtracting the first signal from the second signal to form a subtraction signal.

18. The method of claim 17 wherein the calculated error value is independent of a position of the conductive target.

19. The method of claim 17 wherein first magnetic field has a frequency sufficiently high to induce an eddy current in the conductive target, wherein the reflected magnetic field is produced by the eddy current.

20. The method of claim 17 wherein the second frequency is substantially low so that the second magnetic field does not induce a reflected magnetic field from the conductive target.

21. The method of claim 20 wherein the second frequency is substantially zero.

22. The method of claim 17 wherein:
generating the first magnetic field comprises generating the first magnetic field during a first time period; and
generating the second magnetic field comprises generating the second magnetic field during a second time period.

23. The method of claim 22 wherein the first and second time periods are non-overlapping time periods.

24. The method of claim 22 further comprising:
generating the first signal during the first time period representing;
generating the second signal during the second time period;
calculating an error value based on the first signal measured during the first time period; and
applying the error value to the second signal during the second time period.

25. The method of claim 17, wherein calculating the error value further comprises dividing the summation signal by the subtraction signal.

26. A system comprising:
a first magnetic field sensing element;
a second magnetic field sensing element;
means for generating a first magnetic field having a first non-zero frequency;
means for generating a second magnetic field having a second frequency;
a conductive target positioned to generate a reflected magnetic field in response to the first magnetic field;
means for producing a first signal representing the first magnetic field and the reflected magnetic field during a first alternating time period;
means for producing a second signal representing the second magnetic field during a second alternating time period;
means for calculating an error value as a function of the first and second signals, wherein the error value is based, at least in part, on the second signal during the first time period; and
means for applying the error value to the first signal during the first alternating time period.

\* \* \* \* \*

UNITED STATES PATENT AND TRADEMARK OFFICE
CERTIFICATE OF CORRECTION

PATENT NO. : 10,837,943 B2
APPLICATION NO. : 15/606325
DATED : November 17, 2020
INVENTOR(S) : Hernán D. Romero It is certified that error appears in the above-identified patent and that said Letters Patent is hereby corrected as shown below:

In the Specification

Column 1, Line 20 delete "sensor" and replace with --sensors--.

Column 2, Line 5 delete "elements" and replace with --element--.

Column 2, Line 6 delete "aligned the" and replace with --aligned with the--.

Column 2, Line 41 delete "first," and replace with --first--.

Column 3, Line 45 delete "an" and replace with --and--.

Column 4, Line 1 delete "element (AMR)" and replace with --(AMR) element--.

Column 4, Line 58 delete "Coil" and replace with --Coils--.

Column 5, Line 45 delete "and the symbol" and replace with --and the '•' symbol--.

Column 5, Line 57 delete "140" and replace with --148--.

Column 6, Line 43 delete "directly-coupled" and replace with --directly coupled--.

Column 7, Line 2 delete "at DC" and replace with --at the DC--.

Column 7, Line 12 delete "adjust" and replace with --to adjust--.

Column 7, Line 21 delete "example" and replace with --example,--.

Column 8, Line 61 delete "counter-coil" and replace with --countercoil--.

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,837,943 B2

Column 9, Line 46 delete "This," and replace with --Thus,--.

Column 9, Line 59 delete "coil driver 402" and replace with --coil driver 404--.

Column 10, Line 3 delete "MR driver may" and replace with --MR driver 410 may--.

Column 10, Line 10 delete "MR driver may" and replace with --MR driver 410 may--.

Column 11, Line 60 delete "ration" and replace with --ratio--.

Column 12, Line 18 delete "=off+G" and replace with --=$\mathit{off}$+G--.

Column 12, Line 23 delete "off=" and replace with --$\mathit{off}$=--.

Column 12, Line 66 delete "waveform" and replace with --waveforms--.

Column 13, Line 22 delete "Where" and replace with --where--.

Column 13, Line 27 delete "off" and replace with --$\mathit{off}$--.

Column 13, Line 33 delete "off" and replace with --$\mathit{off}$--.

Column 13, Line 37 delete "off" and replace with --$\mathit{off}$--.

Column 13, Line 49 delete "result" and replace with --result in a--.

Column 13, Line 57 delete "magnetic" and replace with --the magnetic--.

Column 14, Line 10 delete "structures" and replace with --structures,--.

Column 14, Line 13 delete "structures" and replace with --structures,--.

Column 14, Line 14 delete "that that" and replace with --that the--.